US009218959B2

(12) United States Patent
Shimamoto et al.

(10) Patent No.: US 9,218,959 B2
(45) Date of Patent: *Dec. 22, 2015

(54) METHOD OF MANUFACTURING SEMICONDUCTOR DEVICE, METHOD OF PROCESSING SUBSTRATE, SUBSTRATE PROCESSING APPARATUS AND NON-TRANSITORY COMPUTER-READABLE RECORDING MEDIUM

(71) Applicant: Hitachi Kokusai Electric Inc., Tokyo (JP)

(72) Inventors: Satoshi Shimamoto, Toyama (JP); Yugo Orihashi, Toyama (JP); Yoshitomo Hashimoto, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/847,018

(22) Filed: Mar. 19, 2013

(65) Prior Publication Data
US 2013/0252435 A1 Sep. 26, 2013

(30) Foreign Application Priority Data

Mar. 21, 2012 (JP) ................................. 2012-064466
Feb. 12, 2013 (JP) ................................. 2013-025016

(51) Int. Cl.
*H01L 21/31* (2006.01)
*H01L 21/02* (2006.01)

(52) U.S. Cl.
CPC ...... *H01L 21/02263* (2013.01); *H01L 21/0228* (2013.01); *H01L 21/02126* (2013.01); *H01L 21/02211* (2013.01)

(58) Field of Classification Search
CPC ................. H01L 21/0228; H01L 21/02263; H01L 21/02126; H01L 21/02211
USPC .......................................... 438/758, 774, 775
See application file for complete search history.

(56) References Cited

U.S. PATENT DOCUMENTS

| | | | |
|---|---|---|---|
| 2006/0211224 A1 | 9/2006 | Matsuda | |
| 2010/0055320 A1 | 3/2010 | Honma | |
| 2011/0318937 A1* | 12/2011 | Akae et al. | 438/758 |
| 2013/0149873 A1* | 6/2013 | Hirose et al. | 438/763 |

FOREIGN PATENT DOCUMENTS

| | | |
|---|---|---|
| JP | 2008-538127 A | 10/2008 |
| JP | 2010-219500 A | 9/2010 |
| KR | 10-2008-0007129 A | 1/2008 |

* cited by examiner

*Primary Examiner* — Brook Kebede
(74) *Attorney, Agent, or Firm* — Volpe and Koenig, P.C.

(57) ABSTRACT

An object of the present invention is to form a good thin film while suppressing generation of foreign substances in a low temperature region. Provided is a method of manufacturing a semiconductor device, including: (a) forming a thin film containing at least a predetermined element and carbon on a substrate by performing a cycle a predetermined number of times, the cycle including: supplying a source gas containing the predetermined element and a halogen element to the substrate in a process container; and supplying an amine-based gas to the substrate in the process container; and (b) modifying byproducts adhered to an inside of the process container by supplying a nitriding gas into the process container after forming the thin film.

14 Claims, 12 Drawing Sheets

METHOD OF MANUFACTURING SEMICONDUCTOR DEVICE, METHOD OF PROCESSING SUBSTRATE, SUBSTRATE PROCESSING APPARATUS AND NON-TRANSITORY COMPUTER-READABLE RECORDING MEDIUM

CROSS-REFERENCE TO RELATED PATENT APPLICATION

This U.S. non-provisional patent application claims priority under 35 U.S.C. §119 of Japanese Patent Applications No. 2012-064466 and No. 2013-025016, filed on Mar. 21, 2012 and Feb. 12, 2013 respectively, in the Japanese Patent Office, the entire contents of which are hereby incorporated by reference.

BACKGROUND OF THE INVENTION

1. Field of the Invention

The present invention relates to method of manufacturing a semiconductor device including a process of forming a thin film of a substrate, a method of processing a substrate, a substrate processing apparatus and a non-transitory computer-readable recording medium.

2. Description of the Related Art

As semiconductor devices including a transistor or the like come to be manufactured more finely, influence of particles (foreign substances) on yield is being increased. In addition, a need to suppress generation of foreign substances in a film-forming process performed as one process among processes of manufacturing a semiconductor device is also increasing. For example, even when a thin film such as an insulating layer or the like constituting a sidewall spacer (SWS) of a gate electrode included in the transistor is formed, a need to suppress generation of foreign substances in the film-forming process is increased. A silicon carbonitride film (a SiCN film) formed by adding carbon (C) into a silicon nitride film (a SiN film) or a silicon oxycarbonitride (a SiOCN film) formed by further adding oxygen (O) thereto is used as the thin film constituting the sidewall spacer or the like. Since such an insulating layer requires high step coverage characteristics, in many cases, the insulating layer may be formed by a film-forming method such as an alternate supply method of alternately supplying a plurality of kinds of processing gases, or the like.

SUMMARY OF THE INVENTION

Since resistance against hydrogen fluoride (HF) is improved or permittivity is decreased when an insulating layer such as a SiCN film or a SiOCN film is formed, it is effective to reduce a nitrogen concentration in a film to increase a carbon concentration or an oxygen concentration, and for example, the film-forming should be performed in a low temperature region at a temperature of 650° C. or less. However, when the thin film in which the carbon concentration can exceed the nitrogen concentration is formed in the low temperature region at the temperature of 650° C. or less through the alternate supply method of the related art, generation of the foreign substances may be increased by influence of byproducts generated in the process.

Accordingly, it is an aspect of the present invention to provide a method of manufacturing a semiconductor device that is capable of suppressing generation of foreign substances and forming a good thin film in a low temperature region, a method of processing a substrate, a substrate processing apparatus and a recording medium.

According to an aspect of the present invention, there is provided a method of manufacturing a semiconductor device, including:

(a) forming a thin film containing at least a predetermined element and carbon on a substrate by performing a cycle a predetermined number of times, the cycle including: supplying a source gas containing the predetermined element and a halogen element to the substrate in a process container; and supplying an amine-based gas to the substrate in the process container; and (b) modifying byproducts adhered to an inside of the process container by supplying a nitriding gas into the process container after forming the thin film.

According to another aspect of the present invention, there is provided a method of processing a substrate, including:

(a) forming a thin film containing at least a predetermined element and carbon on a substrate by performing a cycle a predetermined number of times, the cycle including: supplying a source gas containing the predetermined element and a halogen element to the substrate in a process container; and supplying an amine-based gas to the substrate in the process container; and (b) modifying byproducts adhered to an inside of the process container by supplying a nitriding gas into the process container after forming the thin film.

According to still another aspect of the present invention, there is provided a substrate processing apparatus including:

a process container configured to accommodate a substrate;

a source gas supply system configured to supply a source gas containing a predetermined element and a halogen element into the process container;

an amine-based gas supply system configured to supply an amine-based gas into the process container;

a nitriding gas supply system configured to supply a nitriding gas into the process container; and a control unit configured to control the source gas supply system, the amine-based gas supply system and the nitriding gas supply system so as to perform: a process of forming a thin film containing at least the predetermined element and carbon on the substrate by performing a cycle a predetermined number of times, the cycle including supplying the source gas to the substrate in the process container and supplying the amine-based gas to the substrate in the process container; and a process of modifying byproducts adhered to an inside of the process container by supplying the nitriding gas into the process container after forming the thin film.

According to still another aspect of the present invention, there is provided a non-transitory computer-readable recording medium storing a program that causes a computer to perform a sequence of forming a thin film containing at least a predetermined element and carbon on a substrate by performing a cycle a predetermined number of times, the cycle including: supplying a source gas containing the predetermined element and a halogen element to the substrate in a process container; and supplying an amine-based gas to the substrate in the process container; and a sequence of modifying byproducts adhered to an inside of the process container by supplying a nitriding gas into the process container after forming the thin film.

DETAILED DESCRIPTION OF THE PREFERRED EMBODIMENTS

Embodiment of the Invention

Hereinafter, an embodiment of the present invention will be described with reference to the accompanying drawings.

(1) Configuration of Substrate Processing Apparatus

Figure 1:
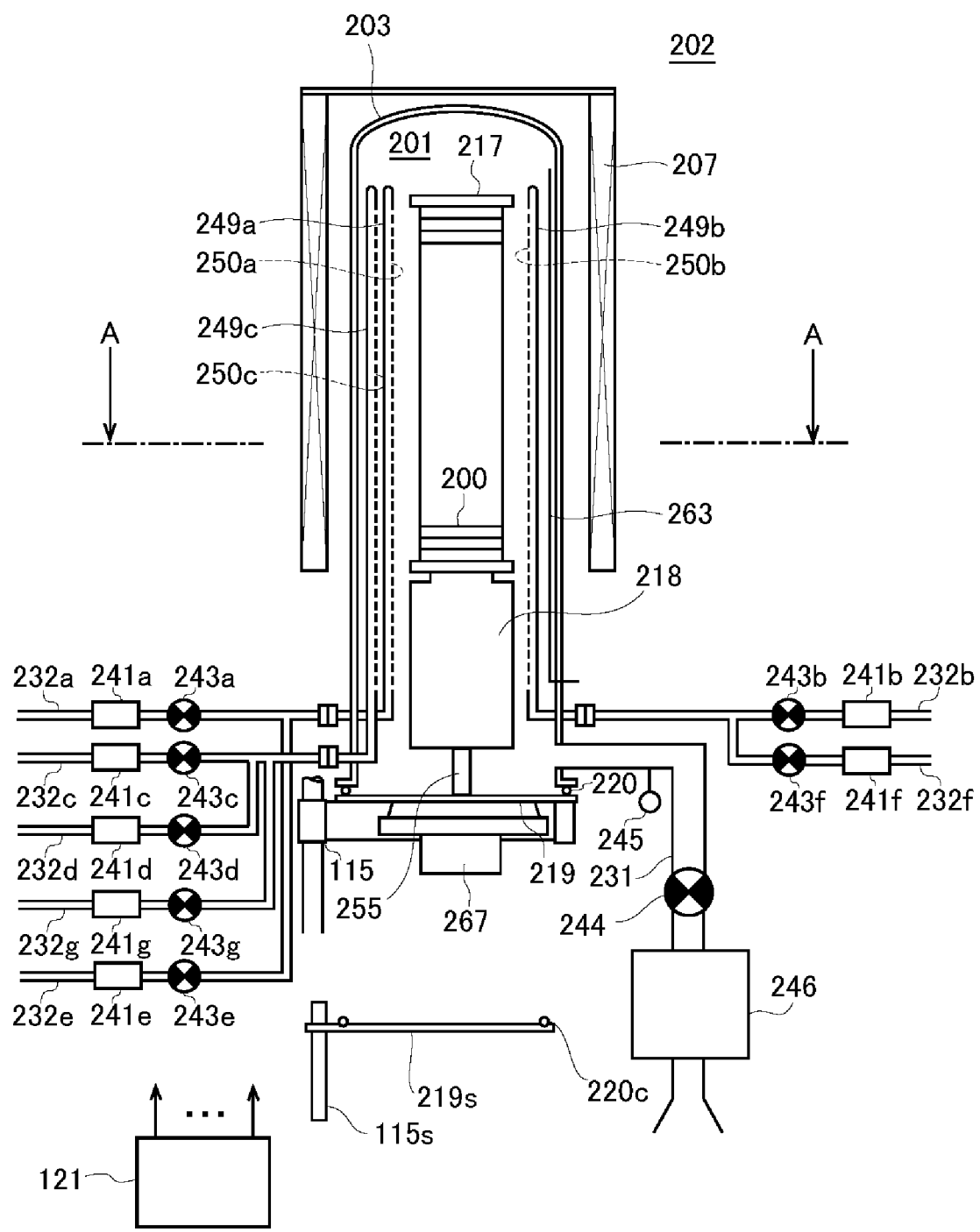
FIG. 1 is a schematic configuration view of a vertical processing furnace of a substrate processing apparatus exemplarily used in an embodiment of the present invention, showing a portion of a processing furnace in a longitudinal cross-sectional view.
Figure 2:
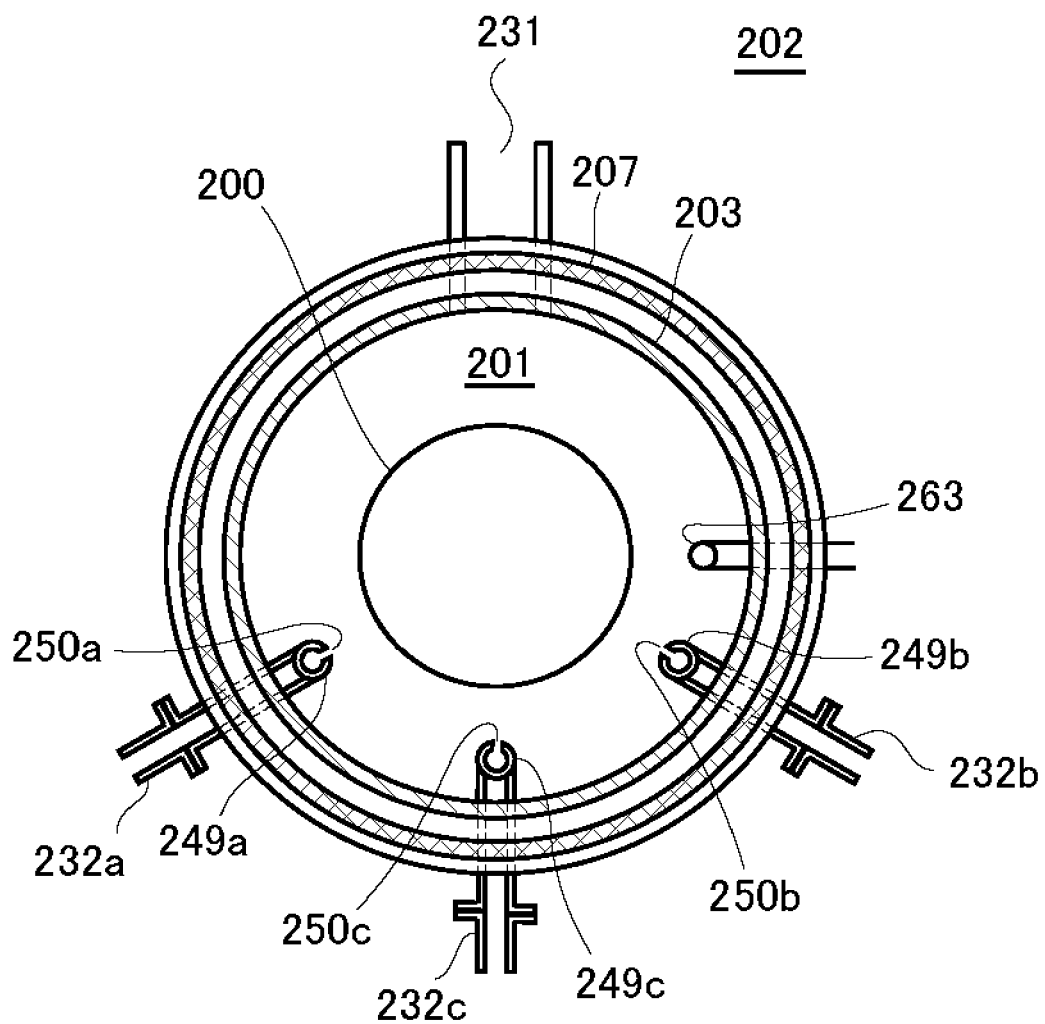
FIG. 2 is a schematic configuration view of the vertical processing furnace of the substrate processing apparatus exemplarily used in the embodiment of the present invention, showing the portion of the processing furnace in a cross-sectional view taken along line A-A of FIG. 1.

FIG. 1 is a schematic configuration view of a vertical processing furnace of a substrate processing apparatus exemplarily used in the embodiment, showing a portion of a processing furnace 202 in a longitudinal cross-sectional view. FIG. 2 is a schematic configuration view of the vertical processing furnace exemplarily used in the embodiment, showing the portion of the processing furnace 202 in a cross-sectional view taken along line A-A of FIG. 1.

As shown in FIG. 1, the processing furnace 202 includes a heater 207 serving as a heating unit (a heating mechanism). The heater 207 has a cylindrical shape and is supported by a heater base (not shown) serving as a holding plate to be vertically installed. In addition, the heater 207 functions as an activation mechanism (an excitation unit) configured to thermally activate (excite) a gas as will be described below.

A reaction tube 203 concentric with the heater 207 and constituting a reaction container (a process container) is installed inside the heater 207. The reaction tube 203 is formed of a heat resistant material such as quartz ($SiO_2$), silicon carbide (SiC), or the like, and has a cylindrical shape with an upper end closed and a lower end open. A process chamber 201 is formed in a cylindrical hollow section of the reaction tube 203, and is configured such that a wafer 200 serving as a substrate can be accommodated by a boat 217 (to be described below) aligned in a horizontal posture in a multi-stage in a vertical direction.

A first nozzle 249a, a second nozzle 249b and a third nozzle 249c are installed in the process chamber 201 to pass through a lower portion of the reaction tube 203. A first gas supply pipe 232a, a second gas supply pipe 232b and a third gas supply pipe 232c are connected to the first nozzle 249a, the second nozzle 249b and the third nozzle 249c, respectively. A fourth gas supply pipe 232d is connected to the third gas supply pipe 232c. As described above, the three nozzles 249a, 249b and 249c and the four gas supply pipes 232a, 232b, 232c and 232d are installed at the reaction tube 203 so that a plurality of kinds, here, four kinds, of gases can be supplied into the process chamber 201.

A manifold formed of metal and configured to support the reaction tube 203 may be installed under the reaction tube 203, and each of the nozzles may be installed to pass through a sidewall of the metal manifold. In this case, an exhaust pipe 231 (to be described later) may be installed at the metal manifold. In addition, even in this case, the exhaust pipe 231 may be installed at the lower portion of the reaction tube 203 rather than the metal manifold. As described above, a furnace port of the processing furnace 202 may be formed of a metal, and the nozzle or the like may be installed at the metal furnace port.

A mass flow controller (MFC) 241a serving as a flow rate controller (a flow rate control unit) and a valve 243a serving as an opening/closing valve are installed at the first gas supply pipe 232a in a sequence from an upstream side. In addition, a first inert gas supply pipe 232e is connected to the first gas supply pipe 232a at a downstream side of the valve 243a. A mass flow controller 241e serving as a flow rate controller (a flow rate control unit) and a valve 243e serving as an opening/closing valve are installed at the first inert gas supply pipe 232e in sequence from the upstream side. Further, the above-mentioned first nozzle 249a is connected to a tip section of the first gas supply pipe 232a. The first nozzle 249a is installed in an arc-shaped space between an inner wall of the reaction tube 203 and the wafer 200 from a lower portion to an upper portion of the inner wall of the reaction tube 203 to stand up in a stacking direction of the wafers 200. That is, the first nozzle 249a is installed at a region horizontally surrounding a wafer arrangement region, in which the wafers 200 are arranged, of a side of the wafer arrangement region, along the wafer arrangement region. The first nozzle 249a is constituted by an L-shaped long nozzle, and has a horizontal section installed to pass through a lower sidewall of the reaction tube 203 and a vertical section installed to stand up from one end side to the other end side of the wafer arrangement region. A gas supply hole 250a configured to supply a gas is formed in a side surface of the first nozzle 249a. The gas supply hole 250a is opened toward a center of the reaction tube 203 so that the gas can be supplied toward the wafer 200. The plurality of gas supply holes 250a are formed from the lower portion to the upper portion of the reaction tube 203, have the same opening area, and are formed at the same opening pitch.

A first gas supply system is mainly constituted by the first gas supply pipe 232a, the mass flow controller 241a and the valve 243a. In addition, the first nozzle 249a may be included in the first gas supply system. Further, a first inert gas supply system is mainly constituted by the first inert gas supply pipe 232e, the mass flow controller 241e and the valve 243e. The first inert gas supply system also functions as a purge gas supply system.

A mass flow controller (MFC) 241b serving as a flow rate controller (a flow rate control unit) and a valve 243b serving as an opening/closing valve are installed at the second gas supply pipe 232b in a sequence from the upstream direction. In addition, a second inert gas supply pipe 232f is connected to the second gas supply pipe 232b at a downstream side of the valve 243b. A mass flow controller 241f serving as a flow rate controller (a flow rate control unit) and a valve 243f serving as an opening/closing valve are installed at the second inert gas supply pipe 232f in sequence from the upstream side. Further, the above-mentioned second nozzle 249b is connected to a tip section of the second gas supply pipe 232b. The second nozzle 249b is installed in an arc-shaped space between the inner wall of the reaction tube 203 and the wafer 200 from the lower portion to the upper portion of the inner wall of the reaction tube 203 to stand up in the stacking direction of the wafers 200. That is, the second nozzle 249b is installed at a region surrounding the wafer arrangement region, in which the wafers 200 are arranged, of the side of the wafer arrangement region along the wafer arrangement region. The second nozzle 249b is constituted by an L-shaped long nozzle, and has a horizontal section installed to pass through the lower sidewall of the reaction tube 203 and a vertical section installed to stand up from the one end side to the other end side of at least the wafer arrangement region. A gas supply hole 250b configured to supply a gas is formed in a side surface of the second nozzle 249b. The gas supply hole 250b is opened toward the center of the reaction tube 203 so that the gas can be supplied toward the wafer 200. The plurality of gas supply holes 250b are installed from the lower portion to the upper portion of the reaction tube 203, have the same opening area, and are installed at the same opening pitch.

A second gas supply system is mainly constituted by the second gas supply pipe 232b, the mass flow controller 241b and the valve 243b. In addition, the second nozzle 249b may be included in the second gas supply system. Further, a second inert gas supply system is mainly constituted by the second inert gas supply pipe 232f, the mass flow controller 241f and the valve 243f. The second inert gas supply system may function as a purge gas supply system.

A mass flow controller (MFC) 241c serving as a flow rate controller (a flow rate control unit) and a valve 243c serving as an opening/closing valve are installed at the third gas supply pipe 232c in sequence from the upstream side. In addition, the fourth gas supply pipe 232d is connected to the third gas supply pipe 232c at a downstream side of the valve 243c. A mass flow controller 241d serving as a flow rate controller (a flow rate control unit) and a valve 243d serving as an opening/closing valve are installed at the fourth gas supply pipe 232d in sequence from the upstream side. Further, a third inert gas supply pipe 232g is connected to the third gas supply pipe 232c at a downstream side of a connecting place to the fourth gas supply pipe 232d. A mass flow controller 241g serving as a flow rate controller (a flow rate control unit) and a valve 243g serving as an opening/closing valve are installed at the third inert gas supply pipe 232g in sequence from the upstream side. In addition, the above-mentioned third nozzle 249c is connected to a tip section of the third gas supply pipe 232c. The third nozzle 249c is installed in an arc-shaped space between the inner wall of the reaction tube 203 and the wafer 200 from the lower portion to the upper portion of the inner wall of the reaction tube 203 to stand up in the stacking direction of the wafers 200. That is, the third nozzle 249c is installed at the region horizontally surrounding the wafer arrangement region, in which the wafers 200 are arranged, of the side of the wafer arrangement region along the wafer arrangement region. The third nozzle 249c is constituted by an L-shaped long nozzle, and has a horizontal section installed to pass through the lower sidewall of the reaction tube 203 and a vertical section installed to stand up from the one end side to the other end side of at least the wafer arrangement region. A gas supply hole 250c configured to supply a gas is formed in a side surface of the third nozzle 249c. The gas supply hole 250c is opened toward the center of the reaction tube 203 so that the gas can be supplied toward the wafer 200. The plurality of gas supply holes 250c are formed from the lower portion to the upper portion of the reaction tube 203, have the same opening area, and are installed at the same opening pitch.

A third gas supply system is mainly constituted by the third gas supply pipe 232c, the mass flow controller 241c and the valve 243c. In addition, the third nozzle 249c may be included in the third gas supply system. Further, a fourth gas supply system is mainly constituted by the fourth gas supply pipe 232d, the mass flow controller 241d and the valve 243d. In addition, the third nozzle 249c disposed at a downstream side of a connecting section of the third gas supply pipe 232c with the fourth gas supply pipe 232d may be included in the fourth gas supply system. In addition, a third inert gas supply system is mainly constituted by the third inert gas supply pipe 232g, the mass flow controller 241g and the valve 243g. The third inert gas supply system also functions as a purge gas supply system.

As described above, in a method of supplying a gas in the embodiment, the gas is conveyed via the nozzles 249a, 249b and 249c disposed in an arc-shaped longitudinal long space defined by the inner wall of the reaction tube 203 and the end section of the plurality of stacked wafers 200, the gas is firstly ejected into the reaction tube 203 near the wafer 200 through the gas supply holes 250a, 250b and 250c opened at the nozzles 249a, 249b and 249c, respectively, and thus a main stream of the gas in the reaction tube 203 is in a direction parallel to the surface of the wafer 200, i.e., in a horizontal direction. According to the above-mentioned configuration, the gas can be evenly supplied to the wafer 200, and a film thickness of a thin film formed on the wafer 200 can be uniformized. In addition, while the gas flowing on the surface of the wafer 200, i.e., the gas remaining after reaction, flows in a direction of an exhaust port, i.e., the exhaust pipe 231 (to be described later), the direction in which the remaining gas flows is appropriately specified at a position of the exhaust port and not limited to the vertical direction.

A chlorosilane-based source gas, which is a source gas containing a predetermined element and a halogen element, for example, a source gas containing at least silicon (Si) and chlorine (Cl), is supplied into the process chamber 201 via the mass flow controller 241a, the valve 243a and the first nozzle 249a through the first gas supply pipe 232a. Here, the chlorosilane-based source gas refers to a chlorosilane-based source material in a gaseous state, for example, a gas obtained by evaporating a chlorosilane-based source material in a liquid state under a normal temperature and a normal pressure, or a chlorosilane-based source material in a gaseous state under a normal temperature and a normal pressure. In addition, the chlorosilane-based source material refers to a silane-based source material including a chloro group, which is a halogen group, and a source material including at least silicon (Si) and chlorine (Cl). That is, here, the chlorosilane-based source material may refer to a kind of halide. In addition, the term "source material" used in the description may refer to "a liquid source material in a liquid state," "a source gas in a gaseous state," or both of these. Accordingly, the term "chlorosilane-based source material" used in the description may refer to "a chlorosilane-based source material in a liquid state," "a chlorosilane-based source gas in a gaseous state," or both of these. For example, hexachlorodisilane ($Si_2Cl_6$, abbreviation: HCDS) gas may be used as the chlorosilane-based source gas. In addition, when the liquid source material in the liquid state is used under the normal temperature and normal pressure as the HCDS gas, the liquid source material is evaporated by an evaporation system such as an evaporator, a bubbler, or the like, to be supplied as a source gas (HCDS gas).

For example, a gas containing amine, i.e., an amine-based gas, which is a reaction gas (a first reaction gas) containing carbon (C) and nitrogen (N), is supplied into the process chamber 201 via the mass flow controller 241b, the valve 243b and the second nozzle 249b through the second gas supply pipe 232b. Here, the amine-based gas is amine in a gaseous state, for example, a gas obtained by evaporating amine in a liquid state under the normal temperature and normal pressure, or a gas containing an amine group such as amine in a gaseous state under the normal temperature and normal pressure. The amine-based gas includes amine such as ethylamine, methylamine, propylamine, isopropylamine, butylamine, isobutylamine, or the like. Here, "amine" is a general name of a compound in which a hydrogen atom of ammonia ($NH_3$) is substituted with a hydrocarbon group such as an alkyl group or the like. That is, the amine includes a hydrocarbon group such as an alkyl group or the like, which is a ligand including a carbon atom. The amine-based gas may refer to a gas containing no silicon because the gas includes three elements of carbon (C), nitrogen (N) and hydrogen (H) but does not include silicon (Si), and may refer to a gas containing no silicon and no metal because the gas does not include silicon or a metal. In addition, the amine-based gas may be a nitrogen-containing gas, a carbon-containing gas, or a hydrogen-containing gas. The amine-based gas may be a gas containing only three elements of carbon (C), nitrogen (N) and hydrogen (H) constituting the amine group. In addition, the term "amine" used in the description may mean "amine in a liquid state," "an amine-based gas in a gaseous state," or both of these. For example, triethylamine [$(C_2H_5)_3N$, abbreviation: TEA] gas may be used as the amine-based gas. In addition, when amine such as TEA that is in a liquid state under the normal temperature and normal pressure is used, the amine in the liquid state is evaporated by an evaporation system such as an evaporator, a bubbler, or the like, to be supplied as a first reaction gas (TEA gas).

For example, a gas containing oxygen (O) (an oxygen-containing gas), i.e., an oxidizing gas (an oxidant gas), which is a reaction gas (a second reaction gas), is supplied into the process chamber 201 via the mass flow controller 241c, the valve 243c and the third nozzle 249c through the third gas supply pipe 232c. For example, oxygen ($O_2$) gas may be used as the oxygen-containing gas.

For example, a gas containing nitrogen (N) (a nitrogen-containing gas), i.e., a nitriding gas (a nitridant gas), which is a modifying gas, is supplied into the process chamber 201 via the mass flow controller 241d, the valve 243d, the third gas supply pipe 232c and the third nozzle 249c through the fourth gas supply pipe 232d. For example, ammonia ($NH_3$) gas may be used as the nitrogen-containing gas.

For example, nitrogen ($N_2$) gas, which is an inert gas, is supplied into the process chamber 201 via the mass flow controllers 241e, 241f and 241g, the valves 243e, 243f and 243g, the gas supply pipes 232a, 232b and 232c, and the nozzles 249a, 249b and 249c through the inert gas supply pipes 232e, 232f and 232g.

In addition, for example, when the above-mentioned gases flow through the respective gas supply pipes, a source gas supply system configured to supply a source gas containing a predetermined element and a halogen group, i.e., a chlorosilane-based source gas supply system, is constituted by the first gas supply system. Further, the chlorosilane-based source gas supply system is also simply referred to as a chlorosilane-based source material supply system. Furthermore, a reaction gas supply system (a first reaction gas supply system), i.e., an amine-based gas supply system, is constituted by the second gas supply system. In addition, the amine-based gas supply system is also simply referred to as an amine supply system. Further, a reaction gas supply system (a second reaction gas supply system), i.e., an oxygen-containing gas supply system serving as an oxidizing gas supply system, is constituted by the third gas supply system. Furthermore, a modifying gas supply system, i.e., a nitrogen-containing gas supply system serving as a nitriding gas supply system, is constituted by the fourth gas supply system.

The exhaust pipe 231 configured to exhaust an atmosphere in the process chamber 201 is installed in the reaction tube 203. When seen in a transverse cross-sectional view as shown in FIG. 2, the exhaust pipe 231 is installed at a side of the reaction tube 203 opposite to a side in which the gas supply hole 250a of the first nozzle 249a, the gas supply hole 250b of the second nozzle 249b and the gas supply hole 250c of the third nozzle 249c are formed, i.e., an opposite side of the gas supply holes 250a, 250b and 250c via the wafer 200. In addition, when seen in a longitudinal cross-sectional view as shown in FIG. 1, the exhaust pipe 231 is installed under a place in which the gas supply holes 250a, 250b and 250c are formed. According to the configuration, the gas supplied in the vicinity of the wafer 200 in the process chamber 201 through the gas supply holes 250a, 250b and 250c flows in a horizontal direction, i.e., in a direction parallel to the surface of the wafer 200, then flows downward, and then is exhausted through the exhaust pipe 231. A main flow of the gas in the process chamber 201 becomes a flow in the horizontal direction as described above.

A vacuum pump 246 serving as a vacuum exhaust apparatus is connected to the exhaust pipe 231 via a pressure sensor 245 serving as a pressure detector (a pressure detection unit) configured to detect the pressure in the process chamber 201 and an APC (Auto Pressure Controller) valve 244 serving as a pressure regulator (a pressure regulation unit). In addition, the APC valve 244 is a valve configured to perform the vacuum exhaust of the inside of the process chamber 201 and stop the vacuum exhaust by opening/closing the valve in a state in which the vacuum pump 246 is operated, and configured to regulate the pressure in the process chamber 201 by adjusting a valve opening angle in a state in which the vacuum pump 246 is operated. An exhaust system is mainly constituted by the exhaust pipe 231, the APC valve 244 and the pressure sensor 245. In addition, the vacuum pump 246 may be included in the exhaust system. The exhaust system is configured to perform the vacuum exhaust such that the pressure in the process chamber 201 arrives at a predetermined pressure (a vacuum level) by adjusting the valve opening angle of the APC valve 244 based on the pressure information detected by the pressure sensor 245 while operating the vacuum pump 246.

A seal cap 219 serving as a furnace port cover configured to hermetically seal the lower end opening of the reaction tube 203 is installed under the reaction tube 203. The seal cap 219 is configured to abut the lower end of the reaction tube 203 from a lower side in the vertical direction. The seal cap 219 is formed of a metal such as stainless steel or the like, and has a disc shape. An O-ring 220 serving as a seal member configured to abut the lower end of the reaction tube 203 is installed at an upper surface of the seal cap 219. A rotary mechanism 267 configured to rotate the boat 217 serving as a substrate holder (to be described later) is installed at a side of the seal cap 219 opposite to the process chamber 201. A rotary shaft 255 of the rotary mechanism 267 is connected to the boat 217 through the seal cap 219. The rotary mechanism 267 is configured to rotate the boat 217 to rotate the wafer 200. The seal cap 219 is constituted to be raised and lowered in the vertical direction by a boat elevator 115 serving as a raising/lowering mechanism vertically installed at the outside of the reaction tube 203. The boat elevator 115 is configured to load and unload the boat 217 into and from the process chamber 201 by raising and lowering the seal cap 219. That is, the boat elevator 115 is constituted by a conveyance apparatus (a conveyance mechanism) configured to convey the boat 217, i.e., the wafer 200, to/from the process chamber 201. In addition, a shutter 219s serving as a furnace port cover configured to hermetically seal the lower end opening of the reaction tube 203 while the seal cap 219 is lowered by the boat elevator 115 is installed under the reaction tube 203. Like the seal cap 219, the shutter 219s is formed of a metal such as stainless steel or the like, and has a disc shape. An O-ring 220c serving as a seal member configured to abut the lower end of the reaction tube 203 is installed at an upper surface of the shutter 219s. An opening/closing operation (a raising/lowering operation, a pivot operation, or the like) of the shutter 219s is controlled by a shutter opening/closing mechanism 115s installed at the outside of the reaction tube 203.

The boat 217 serving as a substrate support member is formed of a heat resistant material such as quartz, silicon carbide, or the like, and configured to concentrically align the plurality of wafers 200 in a horizontal posture and support the wafers 200 in a multi-stage. In addition, an insulating member 218 formed of a heat resistant material such as quartz, silicon carbide, or the like, is installed under the boat 217 so that heat from the heater 207 cannot be easily transferred toward the seal cap 219. Further, the insulating member 218 may be constituted by a plurality of insulating plates formed of a heat resistant material such as quartz, silicon carbide, or the like, and an insulating plate holder configured to support the insulating plate in a horizontal posture in a multi-stage.

A temperature sensor 263 serving as a temperature detector is installed in the reaction tube 203, and an electrical connection state to the heater 207 is adjusted based on the temperature information detected by the temperature sensor 263 so that the temperature in the process chamber 201 reaches a desired temperature distribution. The temperature sensor 263 has an L shape similar to the nozzles 249a, 249b and 249c, and is installed along the inner wall of the reaction tube 203.

Figure 3:
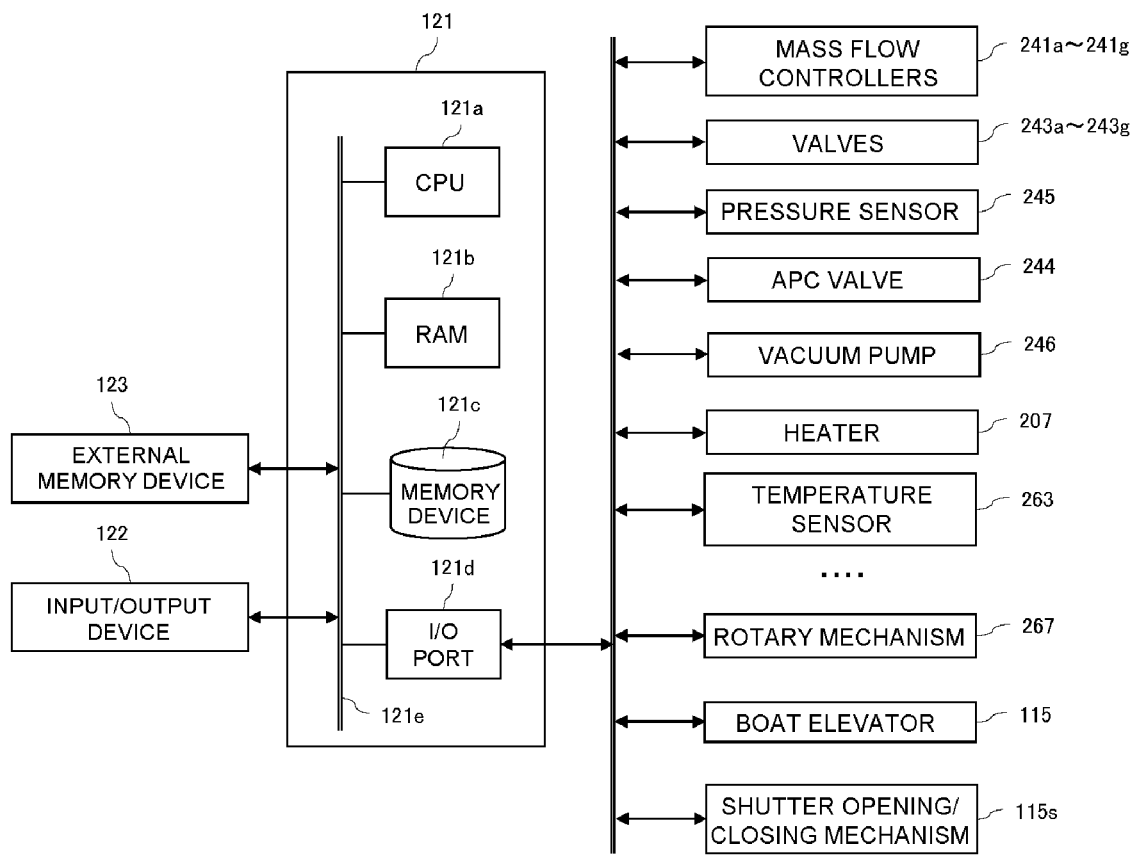
FIG. 3 is a schematic configuration view of a controller of the substrate processing apparatus exemplarily used in the embodiment of the present invention, showing a control system of the controller in a block diagram.

As shown in FIG. 3, a controller 121 serving as a control unit (a control means) is constituted by a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 constituted by, for example, a touch panel, or the like, is connected to the controller 121.

The memory device 121c is constituted by, for example, a flash memory, a hard disk drive (HDD), or the like. A control program configured to control an operation of the substrate processing apparatus, or a process recipe in which a sequence or a condition of film-forming processing (to be described later) or modification processing ($NH_3$ gas purge) of byproducts is readably stored in the memory device 121c. In addition, the process recipe is provided by assembling sequences in the substrate processing process (to be described below) to be performed in the controller 121 to obtain a predetermined result, and functions as a program. Hereinafter, the process recipe or the control program is generally and simply referred to as a program. In addition, the term "program" used in the description may include only the process recipe, only the control program, or both of these. Further, the RAM 121b is constituted by a memory region (a work area) in which a program or data read by the CPU 121a is temporarily held.

The I/O port 121d is connected to the above-mentioned mass flow controllers 241a, 241b, 241c, 241d, 241e, 241f and 241g, the valves 243a, 243b, 243c, 243d, 243e, 243f and 243g, the pressure sensor 245, the APC valve 244, the vacuum pump 246, the heater 207, the temperature sensor 263, the rotary mechanism 267, the boat elevator 115, the shutter opening/closing mechanism 115s, and so on.

The CPU 121a is configured to read and execute the control program from the memory device 121c, and read the process recipe from the memory device 121c according to an input of an operation command from the input/output device 122. In addition, the CPU 121a is configured to control a flow rate control operation of various gases by the mass flow controllers 241a, 241b, 241c, 241d, 241e, 241f and 241g, an opening/closing operation of the valves 243a, 243b, 243c, 243d, 243e, 243f and 243g, an opening/closing operation of the APC valve 244, a pressure regulation operation by the APC valve 244 based on the pressure sensor 245, a temperature adjustment operation of the heater 207 based on the temperature sensor 263, start and stoppage of the vacuum pump 246, a rotation and rotational speed adjustment operation of the boat 217 by the rotary mechanism 267, a raising/lowering operation of the boat 217 by the boat elevator 115, an opening/closing operation of the shutter 219s by the shutter opening/closing mechanism 115s, and so on, according to contents of the read process recipe.

In addition, the controller 121 is not limited to being constituted by an exclusive computer but may be constituted by a general computer. For example, the controller 121 according to the embodiment may be constituted by preparing an external memory device 123 in which the above-mentioned program is stored (for example, a magnetic tape, a magnetic disk such as a flexible disk, a hard disk, or the like, an optical disc such as a CD, a DVD, or the like, an optical magnetic disc such as MO, or a semiconductor memory such as a USB memory, a memory card, or the like), and installing the program in the general computer using the above-mentioned external memory device 123. Further, a unit configured to supply a program to the computer is not limited to the case in which the program is supplied via the external memory device 123. For example, the program may be supplied using a communication means such as the Internet or an exclusive line without the external memory device 123. In addition, the memory device 121c or the external memory device 123 is constituted by a non-transitory computer-readable recording medium. Hereinafter, these are generally and simply referred to as non-transitory computer-readable recording media. Further, the term "non-transitory computer-readable recording medium" used in the description may include only the memory device 121c, only the external memory device 123, or both of these.

(2) Substrate Processing Process

Next, an example of a method of forming a thin film on the wafer 200 in the process container (the process chamber 201)

and modifying an unstable byproduct adhered to the inside of the process container into a stable material will be described as one process among processes of manufacturing a semiconductor device using the processing furnace 202 of the above-mentioned substrate processing apparatus. In addition, in the following description, operations of the respective parts constituting the substrate processing apparatus are controlled by the controller 121.

In the embodiment, a process of forming a thin film containing at least a predetermined element and carbon on a wafer 200 by performing a cycle a predetermined number of times, the cycle including a process of supplying a source gas containing the predetermined element and a halogen element to the wafer 200 in a process container and a process of supplying an amine-based gas to the wafer 200 in the process container; and a process of modifying byproducts adhered to an inside of the process container by supplying a nitriding gas into the process container after forming the thin film; are performed.

Specifically, a process of forming a thin film containing at least a predetermined element, oxygen, carbon and nitrogen or a thin film containing the predetermined element, oxygen and carbon on a wafer 200 by performing a cycle a predetermined number of times, the cycle including a process of supplying a source gas containing the predetermined element and a halogen element to the wafer 200 in a process container, a process of supplying an amine-based gas to the wafer 200 in the process container and a process of supplying an oxidizing gas to the wafer 200 in the process container; and a process of modifying byproducts adhered to an inside of the process container by supplying a nitriding gas into the process container after forming the thin film; are performed.

In addition, the phrase "performed a predetermined number of times" means "performed one time or a plurality of times," i.e., "performed one or more times."

Further, in the embodiment, supply conditions of a plurality of kinds of gases containing a plurality of elements composing the formed thin film are controlled such that a composition ratio of the formed thin film has a stoichiometric composition or a predetermined composition ratio different from the stoichiometric composition. For example, the supply conditions are controlled such that at least one element among the plurality of elements composing the formed thin film is excessive with respect to the stoichiometric composition more than the other elements. Hereinafter, an example in which the film-forming is performed while controlling a ratio of the plurality of elements composing the formed thin film, i.e., a composition ratio of the thin film, will be described.

Figure 4:
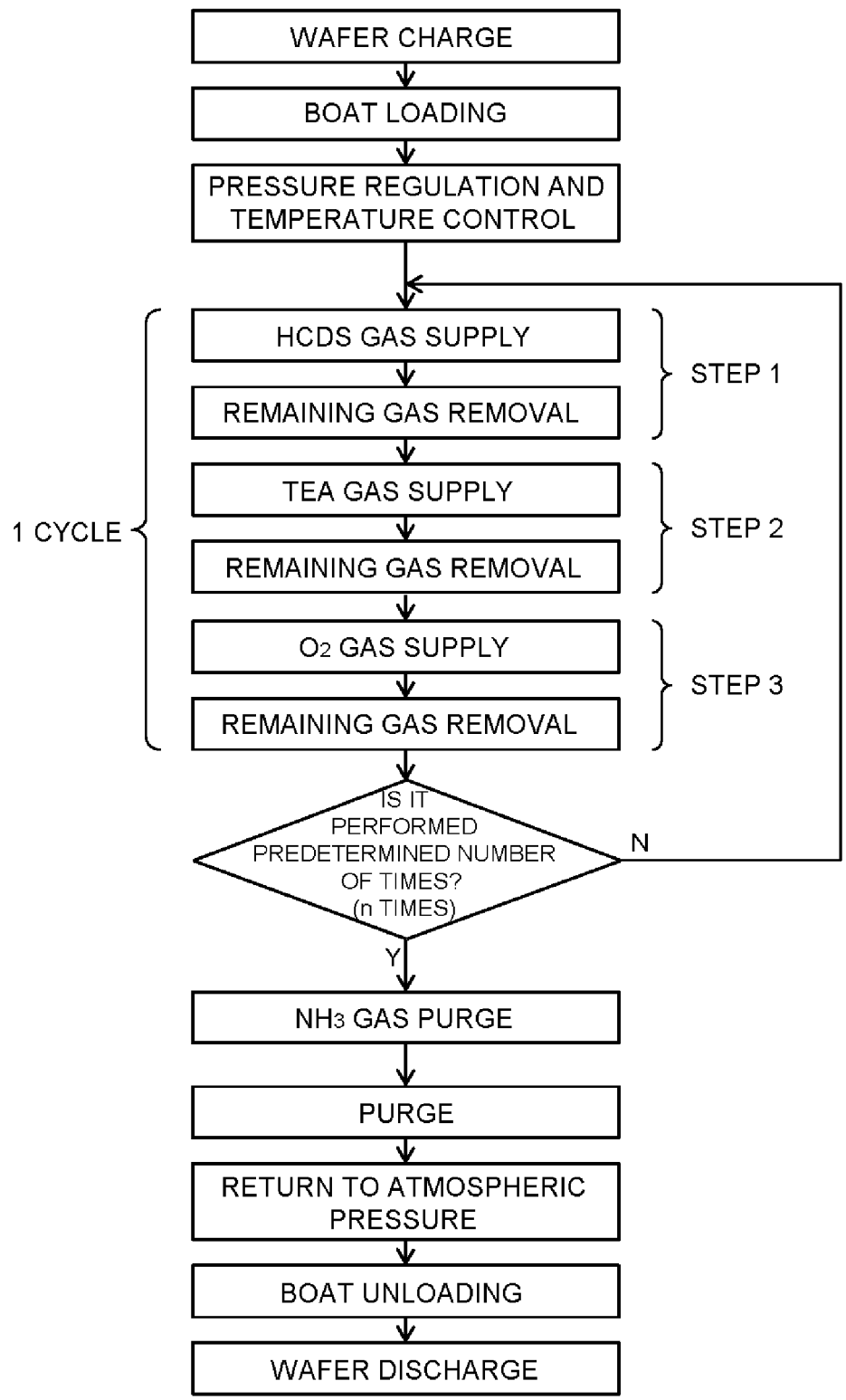
FIG. 4 is a view showing a film-forming flow of the embodiment of the present invention.
Figure 5:
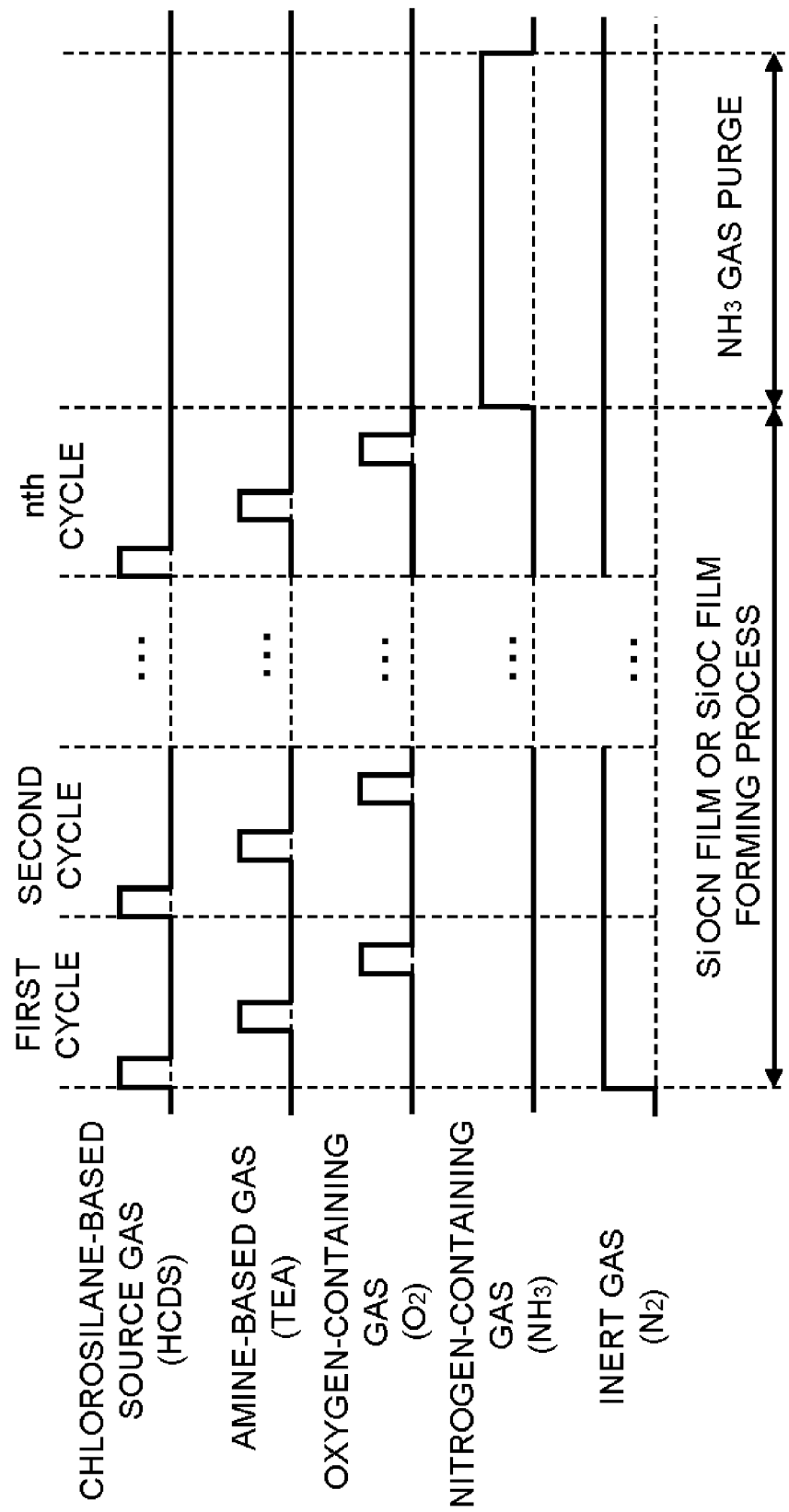
FIG. 5 is a view showing gas supply timing in a film-forming sequence and a modification processing ($NH_3$ gas purge) sequence of byproducts of the embodiment of the present invention.

Hereinafter, a film-forming sequence of the embodiment will be described with reference to FIGS. 4 and 5. FIG. 4 is a view showing a film-forming flow of the embodiment. FIG. 5 is a view showing the gas supply timing in the film-forming sequence and the modification processing ($NH_3$ gas purge) sequence of the byproducts of the embodiment.

In addition, here, an example will be described in which a process of forming a silicon oxycarbonitride film (a SiOCN film) or a silicon oxycarbide film (a SiOC film), which is a silicon-based insulating layer, having a predetermined composition and a predetermined film thickness on the wafer 200 by performing a cycle a predetermined number of times, the cycle including:

a process of forming a first layer including the predetermined element, nitrogen and carbon on a wafer 200 by alternately performing a process of supplying HCDS gas, which is a chlorosilane-based source gas serving as a source gas, to the wafer 200 in a process container and a process of supplying TEA gas, which is an amine-based gas, to the wafer 200 in the process container, and a process of forming a silicon oxycarbonitride layer (a SiOCN layer) or a silicon oxycarbide layer (a SiOC layer), which is a second layer, by supplying $O_2$ gas, which is an oxidizing gas, to the wafer 200 in the process container to modify the first layer; and a process of modifying byproducts adhered to an inside of the process container by supplying $NH_3$ gas, which is a nitriding gas, into the process container after forming the SiOCN film or the SiOC film.

In addition, the term "wafer" used in the description may include only "the wafer itself," or "a stacked body (a collected body) of the wafer and a predetermined layer or film formed on a surface thereof, i.e., the wafer including a predetermined layer of film formed on a surface thereof." In addition, the term "a surface of a wafer" used in the description may include "a surface of the wafer itself (an exposed surface)," or "a surface of a predetermined layer or film formed on the wafer, i.e., the outermost surface of the wafer, which is a stacked body."

Accordingly, the phrase "a predetermined gas is supplied to a wafer" used in the description may include when "a predetermined gas is directly supplied to a surface of the wafer itself (an exposed surface)," or "a predetermined gas is supplied to a layer or a film formed on the wafer, i.e., the outermost surface of the wafer, which is a stacked body." In addition, the phrase "a predetermined layer (or film) is formed on a wafer" used in the description may include when "a predetermined layer (or film) is directly formed on a surface of the wafer itself (an exposed surface)," or "a predetermined layer (or film) is formed on a layer or a film formed on the wafer, i.e., the outermost surface of the wafer, which is a stacked body."

In addition, the term "substrate" used in the description is similar to the term "wafer," and thus "wafer" and "substrate" may be used synonymously in the description.

(Wafer Charge and Boat Loading)

When the plurality of wafers 200 are charged in the boat 217 (wafer charge), the shutter 219s is moved by the shutter opening/closing mechanism 115s to open the lower end opening of the reaction tube 203. As shown in FIG. 1, the boat 217 supporting the plurality of wafers 200 is raised by the boat elevator 115 to be loaded into the process chamber 201 (boat loading). In this state, the seal cap 219 seals the lower end of the reaction tube 203 via the O-ring 220.

(Pressure Regulation and Temperature Control)

The inside of the process chamber 201 is vacuum-exhausted by the vacuum pump 246 to a desired pressure (a vacuum level). Here, the pressure in the process chamber 201 is measured by the pressure sensor 245, and the APC valve 244 is feedback-controlled based on the measured pressure information (pressure regulation). In addition, the vacuum pump 246 maintains an always-operating state at least until the processing of the wafer 200 is terminated. Further, the inside of the process chamber 201 is heated by the heater 207 to a desired temperature. Here, an electrical connection state to the heater 207 is feedback-controlled based on the temperature information detected by the temperature sensor 263 such that the inside of the process chamber 201 reaches a desired temperature distribution (temperature control). In addition, heating of the inside of the process chamber 201 by the heater 207 is continuously performed at least until the processing of the wafer 200 is terminated. Next, rotation of the boat 217 and the wafer 200 is started by the rotary mechanism 267. In addition, rotation of the boat 217 and the wafer 200 by the rotary mechanism 267 is continuously performed at least until the processing of the wafer 200 is terminated.

(Silicon Oxycarbonitride Film or Silicon Oxycarbide Film Forming Process)

Next, the following three steps, i.e., steps 1 to 3 are sequentially performed.

[Step 1]

(HCDS Gas Supply)

The valve 243a of the first gas supply pipe 232a is opened to cause HCDS gas to flow through the first gas supply pipe 232a. The HCDS gas flowing through the first gas supply pipe 232a is flow-rate-controlled by the mass flow controller 241a. The flow-rate-controlled HCDS gas is supplied into the process chamber 201 through the gas supply hole 250a of the first nozzle 249a to be exhausted through the exhaust pipe 231. Here, the HCDS gas is supplied to the wafer 200. Here, simultaneously, the valve 243e is opened to cause $N_2$ gas, which is an inert gas, to flow through the first inert gas supply pipe 232e. The $N_2$ gas flowing through the first inert gas supply pipe 232e is flow-rate-controlled by the mass flow controller 241e. The flow-rate-controlled $N_2$ gas is supplied into the process chamber 201 to be exhausted through the exhaust pipe 231 with the HCDS gas.

In addition, here, in order to prevent invasion of HCDS gas into the second nozzle 249b and the third nozzle 249c, the valves 243f and 243g are opened to cause the $N_2$ gas to flow through the second inert gas supply pipe 232f and the third inert gas supply pipe 232g. The $N_2$ gas is supplied into the process chamber 201 to be exhausted through the exhaust pipe 231 via the second gas supply pipe 232b, the third gas supply pipe 232c, the second nozzle 249b and the third nozzle 249c.

Here, the APC valve 244 is appropriately adjusted such that the pressure in the process chamber 201 is within a range of, for example, 1 to 13,300 Pa, preferably 20 to 1,330 Pa. A supply flow rate of the HCDS gas controlled by the mass flow controller 241a is a flow rate within a range of, for example, 1 to 1,000 sccm. Each supply flow rate of the $N_2$ gas controlled by the mass flow controllers 241e, 241f and 241g is a flow rate within a range of, for example, 100 to 10,000 sccm. A time in which the HCDS gas is supplied to the wafer 200, i.e., a gas supply time (an exposure time), is a time within a range of, for example, 1 to 120 seconds, preferably 1 to 60 seconds. Here, a temperature of the heater 207 is set such that the temperature of the wafer 200 is a temperature within a range of, for example, 250 to 700° C., preferably 300 to 650° C., more preferably 350 to 600° C. In addition, when the temperature of the wafer 200 is less than 250° C., a practical film-forming speed may not be accomplished because the HCDS cannot be easily chemisorbed to the wafer 200. This problem can be solved by increasing the temperature of the wafer to 200 to 250° C. or more. Further, when the temperature of the wafer 200 is set to 300° C. or more, or 350° C. or more, the HCDS can be more sufficiently absorbed to the wafer 200, and a more sufficient film-forming speed can be accomplished. In addition, when the temperature of the wafer 200 exceeds 700° C., the CVD reaction is strengthened (a gas phase reaction becomes dominant), and thus film thickness uniformity is likely to be degraded to make it difficult to control the film thickness uniformity. When the temperature of the wafer 200 is set to 700° C. or less, degradation of the film thickness uniformity can be suppressed to enable the control thereof. In particular, when the temperature of the wafer 200 is 650° C. or less, or 600° C. or less, the surface reaction becomes dominant, and the film thickness uniformity can be easily accomplished to enable easy control thereof. Accordingly, the temperature of the wafer 200 may be a temperature within a range of 250 to 700° C., preferably 300 to 650° C., more preferably 350 to 600° C.

A silicon-containing layer including chlorine (Cl) and having a thickness of, for example, less than one atomic layer to several atomic layers, which is an initial layer including a predetermined element (silicon) and a halogen element (chlorine), is formed on the wafer 200 (a base film of the surface) by supplying the HCDS gas to the wafer 200 under the above-mentioned conditions. A silicon-containing layer including Cl may include an adsorption layer of the HCDS gas, a silicon layer (a Si layer) including Cl, or both of these.

Here, the silicon layer including Cl is a general name including a continuous layer composed of silicon (Si) and including Cl, a discontinuous layer, and a silicon thin film formed by overlapping them and including Cl. In addition, the continuous layer composed of Si and including Cl may refer to the silicon thin film including Cl. Further, Si composing the silicon layer including Cl may include Cl bonds that are completely broken, in addition to Cl bonds that are not completely broken.

The adsorption layer of the HCDS gas also includes a discontinuous chemical adsorption layer in addition to the continuous chemical adsorption layer of the gas molecule of HCDS gas. That is, the adsorption layer of the HCDS gas includes a chemical adsorption layer composed of HCDS molecules and having a thickness of one molecule layer or less than the one molecule layer. In addition, the HCDS ($Si_2Cl_6$) molecules composing the adsorption layer of the HCDS gas include the Si and Cl bonds that are partially broken ($Si_xCl_y$ molecules). That is, the adsorption layer of the HCDS gas includes a continuous chemical adsorption layer or a discontinuous chemical adsorption layer of $Si_2Cl_6$ molecules and/or $Si_xCl_y$ molecules.

In addition, the layer having a thickness of less than one atomic layer is an atomic layer that is discontinuously formed, and the layer having a thickness of one atomic layer is an atomic layer that is continuously formed. Further, the layer having a thickness of less than one molecular layer is a molecular layer that is discontinuously formed, and the layer having a thickness of one molecular layer is a molecular layer that is continuously formed.

Si is accumulated on the wafer 200 to form the silicon layer including Cl under the conditions in which the HCDS gas is autolyzed (pyrolyzed), i.e., the conditions in which a pyrolysis reaction of the HCDS is generated. The HCDS gas is adsorbed onto the wafer 200 to form the adsorption layer of the HCDS gas under the conditions in which the HCDS gas is not autolyzed (pyrolyzed), i.e., the conditions in which a pyrolysis reaction of the HCDS is not generated. In addition, a film-forming rate may be increased when the silicon layer including Cl is formed on the wafer 200, rather than when the adsorption layer of the HCDS gas is formed on the wafer 200.

When the thickness of the silicon-containing layer including Cl formed on the wafer 200 exceeds several atomic layers, an action of modification in the following step 2 and step 3 is not transmitted to the entire silicon-containing layer including Cl. In addition, a minimum value of the thickness of the silicon-containing layer including Cl to be formed on the wafer 200 is less than one atomic layer. Accordingly, the thickness of the silicon-containing layer including Cl may be less than one atomic layer to about several atomic layers. Further, when the thickness of the silicon-containing layer including Cl is one atomic layer or less, i.e., one atomic layer or less than one atomic layer, the action of the modification reaction in the following step 2 and step 3 can be relatively increased, and a time needed for the modification reaction in step 2 and step 3 can be reduced. A time needed to form the silicon-containing layer including Cl can also be reduced. Eventually, a processing time per cycle can be reduced, and a total processing time can also be reduced. That is, the film-forming rate can also be increased. In addition, when the thickness of the silicon-containing layer including Cl is one atomic layer or less, controllability of the film thickness uniformity can also be increased.

(Remaining Gas Removal)

After the silicon-containing layer including Cl is formed as an initial layer, the valve 243a of the first gas supply pipe 232a is closed to stop supply of the HCDS gas. Here, the inside of the process chamber 201 is vacuum-exhausted by the vacuum pump 246 in a state in which the APC valve 244 of the exhaust pipe 231 is open, and the HCDS gas after non-reaction or contribution to formation of the initial layer and remaining in the process chamber 201 is removed from the inside of the process chamber 201. In addition, here, supply of the $N_2$ gas, which is an inert gas, into the process chamber 201 is maintained in a state in which the valves 243e, 243f and 243g are open. The $N_2$ gas serves as a purge gas, and thus an effect of removing the HCDS gas after non-reaction or contribution to formation of the initial layer and remaining in the process chamber 201 from the inside of the process chamber 201 can be increased.

In addition, here, the gas remaining in the process chamber 201 may not be completely removed, and the inside of the process chamber 201 may not be completely purged. When the gas remaining in the process chamber 201 is minute, there is no bad influence in step 2 performed thereafter. Here, a flow rate of the $N_2$ gas supplied into the process chamber 201 need not be a large flow rate, and for example, an amount of $N_2$ gas substantially equal to a capacity of the reaction tube 203 (the process chamber 201) may be supplied to perform the purge such that no bad influence is generated in step 2. As described above, as the inside of the process chamber 201 is not completely purged, the purge time can be reduced to improve throughput. In addition, consumption of the $N_2$ gas can be suppressed to a necessary minimum value.

In addition to hexachlorodisilane ($Si_2Cl_6$, abbreviation: HCDS) gas, an inorganic source gas such as tetrachlorosilane, i.e., silicontetrachloride ($SiCl_4$, abbreviation: STC) gas, trichlorosilane ($SiHCl_3$, abbreviation: TCS) gas, dichlorosilane ($SiH_2Cl_2$, abbreviation: DCS) gas, monochlorosilane ($SiH_3Cl$, abbreviation: MCS) gas, or the like, may be used as the chlorosilane-based source gas. In addition to the $N_2$ gas, a rare gas such as Ar gas, He gas, Ne gas, Xe gas, or the like, may be used as the inert gas.

[Step 2]

(TEA Gas Supply)

After step 1 is terminated and the remaining gas in the process chamber 201 is removed, the valve 243b of the second gas supply pipe 232b is opened to cause the TEA gas to flow through the second gas supply pipe 232b. The TEA gas flowing through the second gas supply pipe 232b is flow-rate-controlled by the mass flow controller 241b. The flow-rate-controlled TEA gas is supplied into the process chamber 201 through the gas supply hole 250b of the second nozzle 249b. The TEA gas supplied into the process chamber 201 is thermally activated (excited) to be exhausted through the exhaust pipe 231. Here, the thermally activated TEA gas is supplied to the wafer 200. Here, simultaneously, the valve 243f is opened to cause the $N_2$ gas, which is an inert gas, to flow through the second inert gas supply pipe 232f. The $N_2$ gas flowing through the second inert gas supply pipe 232f is flow-rate-controlled by the mass flow controller 241f. The flow-rate-controlled $N_2$ gas is supplied into the process chamber 201 to be exhausted through the exhaust pipe 231 with the TEA gas.

In addition, here, in order to prevent invasion of the TEA gas into the first nozzle 249a and the third nozzle 249c, the valves 243e and 243g are opened to cause the $N_2$ gas to flow through the first inert gas supply pipe 232e and the third inert gas supply pipe 232g. The $N_2$ gas is supplied into the process chamber 201 to be exhausted through the exhaust pipe 231 via the first gas supply pipe 232a, the third gas supply pipe 232c, the first nozzle 249a and the third nozzle 249c.

Here, the APC valve 244 is appropriately adjusted such that the pressure in the process chamber 201 is a pressure within a range of, for example, 1 to 13,300 Pa, preferably 399 to 3,990 Pa. When the pressure in the process chamber 201 is a relatively high pressure, the TEA gas can be thermally activated with non-plasma. In addition, since the TEA gas can be thermally activated and supplied to generate a soft reaction, the following modification can be softly performed. A supply flow rate of the TEA gas controlled by the mass flow controller 241b is a flow rate within a range of, for example, 100 to 2,000 sccm. A supply flow rate of the $N_2$ gas controlled by the mass flow controllers 241f, 241e and 241g is a flow rate within a range of, for example, 100 to 10,000 sccm. Here, a partial pressure of the TEA gas in the process chamber 201 is a pressure within a range of, for example, 0.01 to 12,667 Pa. A time in which the thermally activated TEA gas is supplied to the wafer 200, i.e., a gas supply time (an exposure time) is a time within a range of, for example, 1 to 120 seconds, preferably, 1 to 60 seconds. Here, like step 1, the temperature of the heater 207 is set such that the temperature of the wafer 200 is a temperature within a range of, for example, 250 to 700° C., preferably 300 to 650° C., more preferably 350 to 600° C.

The TEA gas can be supplied to the wafer 200 to react the silicon-containing layer including Cl, which is an initial layer formed on the wafer 200 in step 1 with the TEA gas under the above-mentioned conditions. That is, atoms (Cl atoms) of a halogen element included in the silicon-containing layer including Cl, which is an initial layer, can be reacted with ligand (ethyl groups) included in the TEA gas. Accordingly, as at least some of Cl included in the initial layer is drawn (separated) from the initial layer, and simultaneously, at least some ethyl groups of the plurality of ethyl groups included in the TEA gas can be separated from the TEA gas. Then, N of the TEA gas from which at least some ethyl groups are separated can be bonded to Si included in the initial layer. That is, N composing the TEA gas, from which at least some ethyl groups are separated, and including a dangling bonds, can be bonded to Si included in the initial layer including dangling bonds, or Si that includes the dangling bonds, forming Si—N bonds. In addition, here, C included in the ethyl groups, which are ligands of the TEA gas, or C included in the ethyl groups can be bonded to Si included in the initial layer, forming Si—C bonds. As a result, Cl is desorbed from the initial layer, and a N component is newly introduced into the initial layer. In addition, here, a C component is also newly introduced into the initial layer.

Since the TEA gas can be supplied to appropriately react the silicon-containing layer including Cl, which is an initial layer, with the TEA gas under the above-mentioned conditions, the series of reactions can be generated.

The N component and the C component are newly introduced into the initial layer while Cl is desorbed from the initial layer by the series of reactions, and the silicon-containing layer including Cl, which is an initial layer, is changed into the first layer including silicon (Si), nitrogen (N) and carbon (C), i.e., the silicon carbonitride layer (the SiCN layer) (modification). The first layer becomes a layer including Si, N and C and having a thickness of less than one atomic layer to several atomic layers. In addition, the first layer becomes a layer having a relatively high ratio of a Si component and a C component, i.e., a Si-rich or C-rich layer.

In addition, when a layer including Si, N and C is formed as the first layer, chlorine (Cl) included in the silicon-containing layer including Cl and hydrogen (H) included in the TEA gas composes the gaseous material such as chlorine ($Cl_2$) gas, hydrogen ($H_2$) gas or hydrogen chloride (HCl) gas and is discharged from the inside of the process chamber 201 via the exhaust pipe 231 in a modification reaction process of the silicon-containing layer including Cl by the TEA gas. That is, the impurity such as Cl or the like in the initial layer is drawn or desorbed from the initial layer to be separated from the initial layer. Accordingly, the first layer becomes a layer having a smaller amount of impurity such as Cl or the like than that of the initial layer.

(Remaining Gas Removal)

After the first layer is formed, the valve 243b of the second gas supply pipe 232b is closed to stop supply of the TEA gas. Here, the inside of the process chamber 201 is vacuum-exhausted by the vacuum pump 246 in a state in which the APC valve 244 of the exhaust pipe 231 is open, and the TEA gas or the reaction byproduct after non-reaction and contribution to formation of the first layer and remaining in the process chamber 201 is removed from the inside of the process chamber 201. In addition, here, supply of the $N_2$ gas, which is an inert gas, into the process chamber 201 is maintained in a state in which the valves 243f, 243e and 243g are open. The $N_2$ gas serves as a purge gas, and thus an effect of removing the TEA gas or the reaction byproduct after non-reaction or contribution to formation of the first layer and remaining in the process chamber 201 from the inside of the process chamber 201 can be increased.

In addition, here, the gas remaining in the process chamber 201 may not be completely removed, and the inside of the process chamber 201 may not be completely purged. When the gas remaining in the process chamber 201 is minute, no bad influence is generated in step 3 performed thereafter. Here, a flow rate of the $N_2$ gas supplied into the process chamber 201 need not be a large flow rate, and for example, an amount of $N_2$ gas substantially equal to a capacity of the reaction tube 203 (the process chamber 201) can be supplied to perform the purge not to generate bad influence in step 3. As the inside of the process chamber 201 is not completely purged, the purge time can be reduced to improve throughput. In addition, consumption of the $N_2$ gas can be suppressed to a necessary minimum value.

In addition to triethylamine [$(C_2H_5)_3N$, abbreviation: TEA], an ethylamine-based gas obtained by evaporating diethylamine [$(C_2H_5)_2NH$, abbreviation: DEA], monoethylamine ($C_2H_5NH_2$, abbreviation: MEA), or the like, a methylamine-based gas obtained by evaporating trimethylamine [$(CH_3)_3N$, abbreviation: TMA], dimethylamine [$(CH_3)_2NH$, abbreviation: DMA], monomethylamine ($CH_3NH_2$, abbreviation: MMA), or the like, a propylamine-based gas obtained by evaporating tripropylamine [$(C_3H_7)_3N$, abbreviation: TPA], dipropylamine [$(C_3H_7)_2NH$, abbreviation: DPA], monopropylamine ($C_3H_7NH_2$, abbreviation: MPA), or the like, an isopropylamine-based gas obtained by evaporating triisopropylamine ([$(CH_3)_2CH]_3N$, abbreviation: TIPA), diisopropylamine ([$(CH_3)_2CH]_2NH$, abbreviation: DIPA), monoisopropylamine [$(CH_3)_2CHNH_2$, abbreviation: MIPA] or the like, a butylamine-based gas obtained by evaporating tributylamine [$(C_4H_9)_3N$, abbreviation: TBA], dibutylamine [$(C_4H_9)_2NH$, abbreviation: DBA], monobutylamine ($C_4H_9NH_2$, abbreviation: MBA), or the like, or an isobutylamine-based gas obtained by evaporating triisobutylamine ([$(CH_3)_2CHCH_2]_3N$, abbreviation: TIBA), diisobutylamine ([$(CH_3)_2CHCH_2]_2NH$, abbreviation: DIBA), monoisobutylamine [$(CH_3)_2CHCH_2NH_2$, abbreviation: MIBA], or the like, may be used as the amine-based gas. That is, for example, at least one gas of $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, $[(CH_3)_2CHCH_2]_xNH_{3-x}$ (in these formulae, x is an integer of 1 to 3) may be used as the amine-based gas.

In addition, a gas composed of three elements of carbon, nitrogen and hydrogen and having a greater number of carbon atoms than nitrogen atoms in the composition formula (one molecule) may be used as the amine-based gas. That is, a gas containing at least one amine selected from the group consisting of TEA, DEA, MEA, TMA, DMA, TPA, DPA, MPA, TIPA, DIPA, MIPA, TBA, DBA, MBA, TIBA, DIBA and MIBA may be used as the amine-based gas.

When a chlorosilane-based source gas containing a predetermined element (silicon) and a halogen element (chlorine) such as HCDS gas or the like is used as the source gas, a carbon concentration in the first layer formed in step 2, i.e., a carbon concentration in a SiOCN film or a SiOC film formed in a process performed a predetermined number of times (to be described below) can be increased using the amine-based gas composed of three elements of carbon, nitrogen and hydrogen such as TEA gas or DEA gas, which is a first reaction gas, and having a greater number of carbon atoms than nitrogen atoms in the composition formula (one molecule).

On the other hand, when a chlorosilane-based source gas containing a predetermined element (silicon) and a halogen element (chlorine) such as HCDS gas is used as the source gas, since the case of using a gas composed of three elements of carbon, nitrogen and hydrogen, for example, an amine-based gas such as MMA gas or the like, or an organic hydrazine-based gas such as MMH gas, DMH gas, or the like, which is a first reaction gas, and having a number of carbon atoms that is not greater than the number of nitrogen atoms in the composition formula (one molecule) cannot increase a carbon concentration in the first layer, i.e., a carbon concentration in the SiOCN film or SiOC film in comparison with the case of using the amine-based gas serving as the first reaction gas composed of three elements of carbon, nitrogen and hydrogen and having a greater number of carbon atoms than nitrogen atoms in the composition formula (one molecule), it is difficult to realize an appropriate carbon concentration.

In addition, a gas including a plurality of ligands containing carbon (C) atoms in the composition formula (one molecule), i.e., a gas including a plurality of hydrocarbon groups such as alkyl groups or the like in the composition formula (one molecule) may be used as the amine-based gas. Specifically, a gas including three or two ligands (a hydrocarbon group such as an alkyl group or the like) containing a carbon (C) atom in the composition formula (one molecule) may be used as the amine-based gas, and for example, a gas containing at least one amine selected from the group consisting of TEA, DEA, TMA, DMA, TPA, DPA, TIPA, DIPA, TBA, DBA, TIBA and DIBA may be used as the amine-based gas.

When a chlorosilane-based source gas containing a predetermined element (silicon) and a halogen element (chlorine) such as HCDS gas is used as the source gas, the carbon concentration of the first layer, i.e., the carbon concentration of the SiOCN film or SiOC film can be increased using the amine-based gas composed of three elements of carbon, nitrogen and hydrogen such as TEA gas or DEA gas, which is the first reaction gas, and including a plurality of ligands containing carbon atoms in the composition formula (one molecule), i.e., the amine-based gas containing a plurality of hydrocarbon groups such as alkyl groups in the composition formula (one molecule).

On the other hand, when the chlorosilane-based source gas containing silicon and a halogen element (chlorine) such as HCDS gas is used as the source gas, since the case of using a gas that does not includes a plurality of ligands containing carbon atoms in the composition formula (one molecule), for example, an amine-based gas such as MMA gas or the like, or an organic hydrazine-based gas such as MMH gas or the like, which is the first reaction gas, cannot increase the carbon concentration in the first layer, i.e., the carbon concentration in the SiOCN film or SiOC film in comparison with the case of using the amine-based gas serving as the first reaction gas including a plurality of ligands containing carbon atoms in the composition formula (one molecule), it is difficult to realize the appropriate carbon concentration.

In addition, when the amine-based gas including two ligands (hydrocarbon groups such as alkyl groups or the like) containing carbon atoms in the composition formula (one molecule) such as DEA gas is used as the first reaction gas, a cycle rate (a thickness of the SiOCN layer or the SiOC layer formed by a unit cycle) can be improved, and a ratio of the nitrogen concentration with respect to the carbon concentration in the first layer (a ratio of nitrogen concentration/carbon concentration), i.e., a ratio of the nitrogen concentration with respect to the carbon concentration (a ratio of nitrogen concentration/carbon concentration) in the SiOCN film or SiOC film can be increased, in comparison with the case of using the amine-based gas including three ligands (hydrocarbon groups such as alkyl groups or the like) containing carbon atoms in the composition formula (one molecule) such as TEA gas or the like.

On the other hand, when the amine-based gas including three ligands (hydrocarbon groups such as alkyl groups or the like) containing carbon atoms in the composition formula (one molecule) such as TEA gas or the like is used as the first reaction gas, a ratio of the carbon concentration with respect to the nitrogen concentration (a ratio of carbon concentration/nitrogen concentration) in the first layer, i.e., a ratio of the carbon concentration with respect to the nitrogen concentration (a ratio of carbon concentration/nitrogen concentration) in the SiOCN film or SiOC film can be increased, in comparison with the case of using the amine-based gas including two ligands (hydrocarbon groups such as alkyl groups or the like) containing carbon atoms in the composition formula (one molecule) such as DEA gas or the like.

That is, a gas species of the first reaction gas is appropriately varied by the number of ligands (the number of hydrocarbon groups such as alkyl groups or the like) containing carbon atoms included in the first reaction gas, and thus the cycle rate, or the nitrogen concentration or the carbon concentration in the formed SiOCN film or SiOC film can be finely adjusted.

In addition, while it is similar to the above-mentioned description that the gas species (composition) of the amine-based gas serving as the first reaction gas can be appropriately selected to increase the carbon concentration in the SiOCN film or SiOC film, in order to further improve the carbon concentration, for example, the pressure in the process chamber 201 when the amine-based gas (TEA gas) is supplied to the wafer 200 may be greater than the pressure in the process chamber 201 when the chlorosilane-based source gas (HCDS gas) is supplied to the wafer 200 step 1, and may also be greater than the pressure in the process chamber 201 when an oxygen-containing gas ($O_2$ gas) is supplied to the wafer 200 in step 3 (to be described below). In addition, in this case, the pressure in the process chamber 201 when the $O_2$ gas is supplied to the wafer 200 in step 3 may be greater than the pressure in the process chamber 201 when the HCDS gas is supplied to the wafer 200 in step 1. That is, provided that the pressure in the process chamber 201 when the HCDS gas is supplied to the wafer 200 is $P_1$ [Pa], the pressure in the process chamber 201 when the TEA gas is supplied to the wafer 200 is $P_2$ [Pa], and the pressure in the process chamber 201 when the $O_2$ gas is supplied to the wafer 200 is $P_3$ [Pa], the pressures $P_1$ to $P_3$ may be set to satisfy a relation of, preferably $P_2 > P_1$, $P_3$, and more preferably $P_2 > P_3 > P_1$. That is, the pressure in the process chamber 201 when the TEA gas is supplied to the wafer 200 may be greatest among steps 1 to 3.

On the other hand, in order to appropriately suppress an increase in carbon concentration of the SiOCN film or SiOC film, the pressure in the process chamber 201 when the amine-based gas (TEA gas) is supplied to the wafer 200 may be set to be less than or equal to the pressure in the process chamber 201 when the oxygen-containing gas ($O_2$ gas) is supplied to the wafer 200 in step 3 or may be set to be less than or equal to the pressure in the process chamber 201 when the chlorosilane-based source gas (HCDS gas) is supplied to the wafer 200 in step 1. That is, the above-mentioned pressures $P_1$ to $P_3$ may be set to satisfy a relation of $P_3 \geq P_2$, or may be set to satisfy a relation of $P_3$, $P_1 \geq P_2$.

That is, the pressure in the process chamber 201 when the amine-based gas is supplied can be appropriately controlled to finely adjust the carbon concentration in the SiOCN film or SiOC film.

In addition to $N_2$ gas, a rare gas such as Ar gas, He gas, Ne gas, Xe gas, or the like, may be used as the inert gas.

[Step 3]
($O_2$ Gas Supply)

After step 2 is terminated and the remaining gas in the process chamber 201 is removed, the valve 243c of the third gas supply pipe 232c is opened to cause the $O_2$ gas to flow through the third gas supply pipe 232c. The $O_2$ gas flowing through the third gas supply pipe 232c is flow-rate-controlled by the mass flow controller 241c. The flow-rate-controlled $O_2$ gas is supplied into the process chamber 201 via the gas supply hole 250c of the third nozzle 249c. The $O_2$ gas supplied into the process chamber 201 is thermally activated (excited) to be exhausted through the exhaust pipe 231. Here, the thermally activated $O_2$ gas is supplied to the wafer 200. Here, simultaneously, the valve 243g is opened to cause the $N_2$ gas to flow through the third inert gas supply pipe 232g. The $N_2$ gas is supplied into the process chamber 201 to be exhausted through the exhaust pipe 231 with the $O_2$ gas. In addition, here, in order to prevent invasion of $O_2$ gas into the first nozzle 249a and the second nozzle 249b, the valves 243e and 243f are opened to cause the $N_2$ gas to flow through the first inert gas supply pipe 232e and the second inert gas supply pipe 232f. The $N_2$ gas is supplied into the process chamber 201 via the first gas supply pipe 232a, the second gas supply pipe 232b, the first nozzle 249a and the second nozzle 249b to be exhausted through the exhaust pipe 231.

Here, the APC valve 244 is appropriately adjusted such that the pressure in the process chamber 201 is a pressure within a range of, for example, 1 to 3,000 Pa. As the pressure in the process chamber 201 arrives at such a relatively high pressure, the $O_2$ gas can be thermally activated with non-plasma. In addition, since the $O_2$ gas can be thermally activated to be supplied to generate a soft reaction, oxidation (to be described below) can be softly performed. A supply flow rate of the $O_2$ gas controlled by the mass flow controller 241c is a flow rate within a range of, for example, 100 to 10,000 sccm. A supply flow rate of the $N_2$ gas controlled by the mass flow controllers

241g, 241e and 241f may be a flow rate within a range of, for example, 100 to 10,000 sccm. Here, a partial pressure of the $O_2$ gas in the process chamber 201 is a pressure within a range of 0.01 to 2,970 Pa. A time in which the thermally activated $O_2$ gas is supplied to the wafer 200, i.e., a gas supply time (an exposure time) is a time within a range of for example, 1 to 120 seconds, preferably 1 to 60 seconds. Here, like steps 1 and 2, the temperature of the heater 207 is set such that the temperature of the wafer 200 is a temperature within a range of, for example, 250 to 700° C., preferably 300 to 650° C., more preferably 350 to 600° C.

Here, the gas flowing into the process chamber 201 is the $O_2$ gas thermally activated by increasing the temperature in the process chamber 201, and neither HCDS gas nor TEA gas flows into the process chamber 201. Accordingly, the $O_2$ gas does not generate a gaseous reaction, and the activated $O_2$ gas is reacted with at least a portion of the first layer including Si, N and C formed on the wafer 200 in step 2. Accordingly, the first layer is oxidized to be modified as a layer including silicon, oxygen, carbon and nitrogen, which is a second layer, i.e., a silicon oxycarbonitride layer (a SiOCN layer), or a layer including silicon, oxygen and carbon, i.e., a silicon oxycarbide layer (a SiOC layer).

In addition, as the $O_2$ gas is thermally activated to be flowed into the process chamber 201, the first layer can be thermally oxidized to be modified (changed) into the SiOCN layer or the SiOC layer. Here, an O component is added to the first layer to modify the first layer into the SiOCN layer or the SiOC layer. In addition, the Si—O bonding in the first layer is increased by an action of the thermal oxidation due to the $O_2$ gas, and the Si—N bonding, Si—C bonding and Si—Si bonding are reduced to reduce a ratio of a N component, a ratio of a C component, and a ratio of a Si component in the first layer. In addition, here, as the thermal oxidation time is lengthened or an oxidizing power of the thermal oxidation is increased, most of the N component can be desorbed to reduce the N component to an impurity level or substantially remove the N component. That is, the first layer can be modified into the SiOCN layer or the SiOC layer while varying the composition ratio in a direction of increasing the oxygen concentration or in a direction of reducing the nitrogen concentration, the carbon concentration and the silicon concentration. In addition, here, the processing conditions such as the pressure in the process chamber 201, the gas supply time, or the like, can be controlled to finely adjust a ratio of the O component in the SiOCN layer or the SiOC layer, i.e., the oxygen concentration, and the composition ratio of the SiOCN layer or the SiOC layer can be more finely controlled.

In addition, it has been confirmed that the C component in the first layer formed in steps 1 and 2 is richer than the N component. For example, in an experiment, the carbon concentration was two times the nitrogen concentration or more. That is, as the oxidation is blocked before the N component in the first layer is completely desorbed by an action of the thermal oxidation due to the $O_2$ gas, i.e., in a state in which the N component remains, the C component and the N component remain in the first layer so that the first layer is modified into the SiOCN layer. In addition, the C component remains in the first layer even in a step in which most of the N component in the first layer is desorbed by the action of the thermal oxidation due to the $O_2$ gas, and in this state, the oxidation is blocked so that the first layer is modified into the SiOC layer. That is, the gas supply time (the oxidation processing time) or the oxidizing power can be controlled to control a ratio of the C component, i.e., the carbon concentration, and any one layer of the SiOCN layer and the SiOC layer can be formed while controlling the composition ratio.

In addition, here, the processing condition such as the pressure in the process chamber 201, the gas supply time, or the like, can be controlled to finely adjust the ratio of the O component in the SiOCN layer or the SiOC layer, i.e., the oxygen concentration, and the composition ratio of the SiOCN layer or the SiOC layer.

In addition, here, it is preferable that the oxidation reaction of the first layer be unsaturated. For example, when the first layer having a thickness of less than one atomic layer to several atomic layers is formed, it is preferable that a portion of the first layer be oxidized. In this case, the oxidation is performed under the conditions in which the oxidation reaction of the first layer is unsaturated such that the entire first layer having a thickness of less than one atomic layer to several atomic layers is not oxidized.

Further, while the processing conditions in step 3 may be the above-mentioned processing conditions to cause the oxidation reaction of the first layer to be unsaturated, the processing conditions in step 3 are set to the following processing condition to cause unsaturation of the oxidation reaction of the first layer.

Wafer temperature: 500 to 650° C.
Pressure in process chamber: 133 to 2,666 Pa
$O_2$ gas partial pressure: 133 to 2,515 Pa
$O_2$ gas supply flow rate: 1,000 to 5,000 sccm
$N_2$ gas supply flow rate: 300 to 3,000 sccm
$O_2$ gas supply time: 6 to 60 seconds
(Remaining Gas Removal)

After the second layer is formed, the valve 243c of the third gas supply pipe 232c is closed to stop supply of the $O_2$ gas. Here, the inside of the process chamber 201 is vacuum-exhausted by the vacuum pump 246 in a state in which the APC valve 244 of the exhaust pipe 231 is open, and the $O_2$ gas of the reaction byproduct after non-reaction or contribution to formation of the second layer and remaining in the process chamber 201 is removed from the inside of the process chamber 201. In addition, here, supply of the $N_2$ gas into the process chamber 201 is maintained in a state in which the valves 243g, 243e and 243f are open. The $N_2$ gas serves as the purge gas, and thus an effect of removing the $O_2$ gas or the reaction byproduct after non-reaction or contribution to formation of the second layer and remaining in the process chamber 201 from the inside of the process chamber 201 can be increased.

In addition, here, the gas remaining in the process chamber 201 may not be completely removed, and the inside of the process chamber 201 may not be completely purged. When the gas remaining in the process chamber 201 is minute, there is no bad influence in step 1 performed thereafter. Here, a flow rate of the $N_2$ gas supplied into the process chamber 201 need not be a large flow rate, and for example, an amount of gas substantially equal to a capacity of the reaction tube 203 (the process chamber 201) may be supplied to perform the purge such that there is no bad influence generated in step 1. As described above, as the inside of the process chamber 201 is not completely purged, the purge time can be reduced to improve throughput. In addition, consumption of the $N_2$ gas can be suppressed to a necessary minimum value.

In addition to the $O_2$ gas, nitrous oxide ($N_2O$) gas, nitrogen monoxide (NO) gas, nitrogen dioxide ($NO_2$) gas, ozone ($O_3$) gas, hydrogen ($H_2$) gas+oxygen ($O_2$) gas, $H_2$ gas+$O_3$ gas, vapor ($H_2O$) gas, carbon monoxide (CO) gas, carbon dioxide ($CO_2$) gas, or the like, may be used as the oxygen-containing gas (the oxidizing gas). In addition to the $N_2$ gas, a rare gas such as Ar gas, He gas, Ne gas, Xe gas, or the like, may be used as the inert gas.

(Performing Predetermined Number of Times)

The above-mentioned steps 1 to 3 are set as one cycle, and the cycle may be performed a predetermined number of times to form a film including silicon, oxygen, carbon and nitrogen, i.e., a silicon oxycarbonitride film (a SiOCN film), or a film including silicon, oxygen and carbon, i.e., a silicon oxycarbide film (a SiOC film), which has a predetermined composition and a predetermined film thickness, on the wafer 200. In addition, the cycle may be performed a plurality of times. That is, a thickness of the SiOCN layer or the SiOC layer formed by one cycle is set to be smaller than a desired film thickness, and the above-mentioned cycle may be performed a plurality of times until the thickness arrives at the desired film thickness.

In addition, when the cycle is performed a plurality of times, the phrase "a predetermined gas is supplied to the wafer 200" used in each step after at least the second cycle means "a predetermined gas is supplied to a layer formed on the wafer 200, i.e., the outermost surface of the wafer 200, which is a stacked body," and the phrase "a predetermined layer is formed on the wafer 200" means "a predetermined layer is formed on a layer formed on the wafer 200, i.e., the outermost layer of the wafer 200, which is a stacked body." This is similar to the above-mentioned description. In addition, this will be similar in the following other embodiments.

Here, when the cycle including the above-mentioned steps 1 to 3 is repeated, an alkylamine salt including an alkyl group or byproducts including hydrochloric acid (HCl) or the like may be adhered and accumulated onto a surface of a member in the process chamber 201, i.e., an inner wall of the reaction tube 203, upper surfaces of the boat 217, the first nozzle 249a, the second nozzle 249b, the third nozzle 249c and the seal cap 219, a side surface of the rotary shaft 255, a side surface or a bottom surface of the insulating member 218, and an inner wall of the exhaust pipe 231. In particular, when the inside of the process chamber 201 is a low temperature region of 250 to 700° C. or 650° C. or less, the adhesion of the byproduct becomes noticeable. In addition, the adhesion of the byproduct becomes noticeable in a region having a relatively low temperature in the process chamber 201, i.e., a region not surrounded by the heater 207 excluding a region horizontally surrounding the wafer arrangement region (hereinafter referred to as a low temperature region in the process chamber 201), in comparison with a region having a relatively high temperature in the process chamber 201, i.e. a region surrounded by the heater 207 and horizontally surrounding the wafer arrangement region (hereinafter referred to as a high temperature region in the process chamber 201). The byproduct is a material generated by reaction of a material such as HCDS gas or the like adhered and remaining on the surface of the member in the process chamber 201 with a reaction gas such as TEA gas or the like, and having activity (for example, oxidativity). Accordingly, a film formed by accumulation of the byproduct (an accumulated film) is a film having a small bonding power in a structure (a bonding power between composition materials) and having a low density, which is easily damaged and exfoliated. The deposited film may be exfoliated to generate particles (foreign substances) due to vibrations upon rotation or conveyance of the boat 217, a change in quality due to air exposure upon the boat unloading, thermal expansion or thermal shrinkage when the temperature in the process chamber 201 is raised/lowered or when the temperature in the process chamber 201 is varied. In addition, the exfoliation of the deposited film is remarkably generated, in particular, in the low temperature region in the process chamber 201, i.e., a region lower than a region surrounded by the heater 207.

When the foreign substances are adhered to the wafer 200, quality of the manufactured semiconductor device can be reduced. For example, the foreign substances adhered to the wafer 200 may be introduced into the thin film formed on the wafer 200 to decrease film quality. In addition, for example, when exposure patterning of an integrated circuit on the wafer 200 after formation of the thin film is performed, if the wafer 200 to which foreign substances are adhered is placed on an exposure machine stage, the foreign substances are introduced between the stage and the wafer 200 to cause deviation in distance (deviation in focal distance) of an optical system of an exposure apparatus and the wafer 200, deteriorating patterning precision. In addition, for example, as the foreign substances are introduced into apertures between interconnections formed on the surface of the wafer 200 or the apertures are clogged by the foreign substances, formation of the thin film in the apertures in the thin film forming process performed thereafter may be inhibited. Further, while cleaning of the inside of the process chamber 201 may be frequently performed to suppress generation of the foreign substances, in this case, a maintenance time (a stoppage time, i.e., a down time) of the substrate processing apparatus may be increased and productivity decreased.

In addition, the byproducts including the alkylamine salt, the hydrochloric acid (HCl), or the like, have properties of instability, easy emission of chlorine (Cl) or the like, and easy generation of a chlorine-containing gas or the like. The gas generated from the byproducts may decrease the film quality of the thin film formed on the wafer 200 or exert bad influence on a body of a maintenance worker or an operator. Further, since the byproducts including the alkylamine salt, the hydrochloric acid (HCl), or the like, have activity (for example, oxidativity), metal components such as the seal cap 219, the rotary shaft 255, or the like, may be damaged due to corrosion or the like. In addition, the metal member may be damaged due to corrosion or the like by the chlorine-containing material or the like emitted from the byproduct. As a result, the maintenance frequency of the substrate processing apparatus may be increased to decrease productivity, or generation of the foreign substances from the damaged metal member may cause a decrease in quality of the semiconductor device.

In addition, such a task may be a specific task generated when the C concentration in the SiOCN film or the SiOC film formed on the wafer 200 is to be increased, i.e., a specific task generated when the SiOCN film or the SiOC film is formed using the chlorosilane-based source gas and the amine-based gas.

As described above, in order to increase the C concentration in the SiOCN film or the SiOC film formed on the wafer 200, a cycle including a process of supplying a source gas (for example, HCDS gas) containing a predetermined element and a halogen element to the wafer 200 in the process container and a process of supplying an amine-based gas (for example, TEA gas) to the wafer 200 in the process container is effectively performed a predetermined number of times. The TEA gas serving as the amine-based gas may be supplied to the wafer 200 to appropriately react the silicon-containing layer including Cl serving as the initial layer with the TEA gas under the appropriate conditions, and the C component can be newly added to the initial layer, i.e., the first layer. Eventually, the C concentration in the SiOCN film or the SiOC film formed on the wafer 200 can be increased.

On the other hand, the C concentration in the SiOCN film or the SiOC film formed on the wafer 200 cannot be easily increased in the case of using a carbon-containing gas (for example, $C_3H_6$ gas) and a nitrogen-containing gas (for example, $NH_3$ gas) serving as a carbon source and nitrogen source instead of the amine-based gas, in comparison with the case of using the amine-based gas. That is, since the C component cannot be easily introduced into the initial layer formed on the wafer 200 in the case of forming the thin film on the wafer 200 by performing a cycle including a process of supplying the HCDS gas to the wafer 200 in the process container and a process of supplying $C_3H_6$ gas and $NH_3$ gas to the wafer 200 in the process container a predetermined number of times in comparison with the case of using the amine-based gas, the C concentration in the SiOCN film or the SiOC film formed on the wafer 200 cannot be easily increased in comparison with the case of using the amine-based gas.

When the C concentration in the thin film formed on the wafer 200 is to be increased, it is important to use the amine-based gas such as the TEA gas.

However, when a cycle including a process of supplying a source gas containing a predetermined element and a halogen element to the wafer 200 in the process container and a process of supplying an amine-based gas to the wafer 200 in the process container is performed a predetermined number of times to form a thin film on the wafer 200, i.e., when the thin film is formed using the chlorosilane-based source gas and the amine-based gas, as described above, when the byproducts including alkylamine salts, HCl, and the like are adhered to the surface of the member in the process chamber 201, this becomes a factor generating particles. In particular, when formation of the thin film on the wafer 200 is to be performed in the low temperature region of 250 to 700° C., or less than 650° C., in addition, in particular, this phenomenon is remarkably generated in the low temperature region (a region not surrounded by the heater 207) in the process chamber 201.

On the other hand, when the carbon-containing gas (for example, $C_3H_6$ gas) is used as a carbon source and the nitrogen-containing gas (for example, $NH_3$ gas) is used as a nitrogen source, instead of the amine-based gas, since unstable byproducts such as alkylamine salts or the like are not generated, the above-mentioned phenomenon is not generated.

Accordingly, in the embodiment, in order to solve the specific problems generated when the SiOCN film or the SiOC film is formed using the chlorosilane-based source gas and the amine-based gas, processing of modifying the unstable byproducts including alkylamine salts or hydrochloric acid (HCl) accumulated on the surface of the member in the process chamber 201 after formation of the SiOCN film or the SiOC film into a stable material such as ammonium chloride ($NH_4Cl$) or the like, i.e., modification processing of the byproducts (hereinafter referred to as $NH_3$ gas purge) is performed. Hereinafter, such processing will be described in detail.

($NH_3$ Gas Purge)

The valve 243d of the fourth gas supply pipe 232d is opened to cause the $NH_3$ gas to flow through the fourth gas supply pipe 232d. The $NH_3$ gas flowing through the fourth gas supply pipe 232d is flow-rate-controlled by the mass flow controller 241d. The flow-rate-controlled $NH_3$ gas is supplied into the process chamber 201 through the gas supply hole 250c of the third nozzle 249c. The $NH_3$ gas supplied into the process chamber 201 is thermally activated (excited) to be exhausted through the exhaust pipe 231. Here, the thermally activated $NH_3$ gas is supplied to a surface of a member in the process chamber 201, i.e., an inner wall of the reaction tube 203, upper surfaces of the boat 217, the first nozzle 249a, the second nozzle 249b, the third nozzle 249c and the seal cap 219, a side surface of the rotary shaft 255, a side surface or a bottom surface of the insulating member 218, an inner wall of the exhaust pipe 231, or the like. Here, simultaneously, the valve 243g is opened to cause the $N_2$ gas to flow through the third inert gas supply pipe 232g. The $N_2$ gas is supplied into the process chamber 201 to be exhausted through the exhaust pipe 231 with the $NH_3$ gas. In addition, here, in order to prevent invasion of the $NH_3$ gas into the first nozzle 249a and the second nozzle 249b, the valves 243e and 243f are opened to cause the $N_2$ gas to flow through the first inert gas supply pipe 232e and the second inert gas supply pipe 232f. The $N_2$ gas is supplied into the process chamber 201 via the first gas supply pipe 232a, the second gas supply pipe 232b, the first nozzle 249a and the second nozzle 249b to be exhausted through the exhaust pipe 231.

Here, the APC valve 244 is appropriately adjusted such that the pressure in the process chamber 201 arrives at a pressure within a range of, for example, 1 to 3,000 Pa. The pressure in the process chamber 201 can arrive at a relatively high pressure so that the $NH_3$ gas can be thermally activated with non-plasma. In addition, since the $NH_3$ gas can be thermally activated and supplied to generate a soft reaction, nitration (modification) (to be described below) can be softly performed. A supply flow rate of the $NH_3$ gas controlled by the mass flow controller 241d is a flow rate within a range of, for example, 100 to 10,000 sccm. A supply flow rate of the $N_2$ gas controlled by the mass flow controllers 241g, 241e and 241f is a flow rate within a range of, for example, 100 to 10,000 sccm. Here, a partial pressure of the $NH_3$ gas in the process chamber 201 is a pressure within a range of 0.01 to 2,970 Pa. A time in which the thermally activated $NH_3$ gas is supplied into the process chamber 201, i.e., a gas supply time (an exposure time) is a time within a range of, for example, 5 to 60 minutes, preferably 10 to 30 minutes. Here, similar to steps 1 to 3, the temperature of the heater 207 is set such that the temperature of the wafer 200 is a temperature within a range of, for example, 250 to 700° C., preferably 300 to 650° C., more preferably 350 to 600° C.

Here, the gas flowing through the process chamber 201 is the $NH_3$ gas thermally activated by increasing the pressure in the process chamber 201, and neither HCDS gas, TEA gas nor $O_2$ gas flows into the process chamber 201. Accordingly, the $NH_3$ gas does not cause a gaseous reaction, and the activated $NH_3$ gas is supplied to the byproduct accumulated on the surface of the member in the process chamber 201, i.e., the byproducts including alkylamine salts or hydrochloric acid (HCl) accumulated on an inner wall of the reaction tube 203, upper surfaces of the boat 217, the first nozzle 249a, the second nozzle 249b, the third nozzle 249c and the seal cap 219, a side surface of the rotary shaft 255, a side surface or a bottom surface of the insulating member 218, an inner wall of the exhaust pipe 231, or the like. As a result, the byproducts accumulated on the surface of the member in the process chamber 201 are nitrated to be changed (modified) into a stable material such as ammonium chloride ($NH_4Cl$) or the like. That is, the unstable (active) byproducts such as alkylamine salts, hydrochloric acid (HCl), or the like, may be deactivated into a stable (inactive) material. In addition, the deposited film formed by accumulating the byproducts is modified into a film having bonding power (a bonding power between composition materials) and high density in a structure, i.e., a strong film that cannot be easily exfoliated.

In addition, when the $NH_3$ gas purge is performed as an after purge in the process chamber 201 after the film-forming, some of the activated $NH_3$ gas is supplied to the SiOCN film or the SiOC film formed on the wafer 200 to be reacted with a portion of the SiOCN film or the SiOC film. However, it has been confirmed that, even when such a reaction is generated, only an extremely shallow surface layer of the SiOCN film or the SiOC film is nitrated, and there is almost no influence on film quality of the entire SiOCN film or SiOC film. In particular, the $NH_3$ gas is thermally activated rather than with plasma, and influence to the film quality of the SiOCN film or the SiOC film can be extremely reduced.

In addition to the $NH_3$ gas, a gas including a compound such as diazene ($N_2H_2$) gas, hydrazine ($N_2H_4$) gas, $N_3H_8$ gas, or the like, may be used as a nitrogen-containing gas (a nitriding gas). In addition to the $N_2$ gas, a rare gas such as Ar gas, He gas, Ne gas, Xe gas, or the like, may be used as the inert gas.

(Purge and Return to Atmospheric Pressure)

When the modification of the byproducts is performed, the valve 243d of the fourth gas supply pipe 232d is closed to stop supply of the $NH_3$ gas into the process chamber 201. In addition, the valves 243e, 243f and 243g are opened, and the $N_2$ gas serving as the inert gas is supplied into the process chamber 201 through the first inert gas supply pipe 232e, the second inert gas supply pipe 232f and the third inert gas supply pipe 232g to be exhausted through the exhaust pipe 231. The $N_2$ gas serves as the purge gas, and thus the inside of the process chamber 201 is purged with the inert gas so that the gas or the reaction byproducts remaining in the process chamber 201 are removed from the inside of the process chamber 201 (purge). After that, the atmosphere in the process chamber 201 is substituted with the inert gas (inert gas substitution), and thus the pressure in the process chamber 201 returns to a normal pressure (return to atmospheric pressure).

(Boat Unloading and Wafer Discharge)

Next, the seal cap 219 is lowered by the boat elevator 115 to open the lower end of the reaction tube 203, and the processed wafer 200 is unloaded from the lower end of the reaction tube 203 to the outside of the reaction tube 203 in a state in which the wafer 200 is supported by the boat 217 (boat unloading). After the boat unloading, the shutter 219s is moved by the shutter opening/closing mechanism 115s to seal the lower end opening of the reaction tube 203 (shutter closing). After that, the processed wafer 200 is discharged by the boat 217 (wafer discharge).

(3) Effects According to the Embodiment

According to the embodiment, one or a plurality of the following effects are provided.

(a) According to the embodiment, processing ($NH_3$ gas purge) of supplying the $NH_3$ gas serving as the nitriding gas into the process chamber 201 after formation of the SiOCN film or the SiOC film is performed. Accordingly, the unstable byproduct including alkylamine salts or hydrochloric acid (HCl) accumulated on the surface of the member in the process chamber 201 may be nitrated to be changed (modified) into a stable material such as ammonium chloride ($NH_4Cl$) or the like. In addition, the deposited film formed by accumulating the byproduct is modified into a film having strong bonding power (a bonding power between composition materials) and high density in a structure, i.e., a strong film that cannot be easily exfoliated. As a result, generation of the foreign substances due to exfoliation of the deposited film can be suppressed. That is, even when the SiOCN film or the SiOC film is formed in the low temperature region within a range of, for example, 250 to 700° C., preferably 300 to 650° C., more preferably 350 to 600° C., or in the low temperature region of the process chamber 201, generation of the foreign substances can be effectively suppressed. As a result, quality of the semiconductor device can be improved to increase yield. In addition, a cleaning frequency in the process chamber can be reduced to improve productivity of the substrate processing apparatus.

(b) According to the embodiment, as the byproducts constituting the deposited film are changed into a stable material such as ammonium chloride ($NH_4Cl$) or the like, generation of the chlorine-containing gas or the like from the deposited film can be suppressed. As a result, film quality of the thin film formed on the wafer 200 can be improved. In addition, a maintenance worker or operator can safely perform the operation.

(c) According to the embodiment, as the byproducts constituting the deposited film are changed into a stable material such as ammonium chloride ($NH_4Cl$) or the like, emission of the chlorine-containing material or the like from the deposited film can be suppressed. Accordingly, the damage such as corrosion or the like applied to the metal member such as the seal cap 219, the rotary shaft 255, or the like, can be reduced, and a maintenance frequency of the substrate processing apparatus can be reduced to improve productivity. In addition, generation of the foreign substances from the metal member can be suppressed to improve quality of the semiconductor device.

(d) According to the embodiment, after steps 1 and 2 are alternately performed to form the first layer including Si, N and C, $O_2$ gas serving as an oxygen-containing gas, which is a second reaction gas, is supplied to oxidize the first layer, and step 3 is performed to modify the first layer into the SiOCN layer or the SiOC layer, which is the second layer, enabling adjustment of the composition ratio of oxygen, carbon and nitrogen in the SiOCN film or the SiOC film. In addition, here, as the $O_2$ gas is thermally activated and supplied, Si—O bonding of the SiOCN film or the SiOC film can be increased and Si—C bonding, Si—N bonding and Si—Si bonding can be reduced by an action of thermal oxidation. That is, the composition ratio can be varied in a direction of increasing an oxygen concentration or a direction of reducing a nitrogen concentration, a carbon concentration and a silicon concentration. In addition, here, as the thermal oxidation time is lengthened or the oxidizing power in the thermal oxidation is increased, the composition ratio can be varied in the direction of increasing the oxygen concentration or the direction of reducing the nitrogen concentration, the carbon concentration and the silicon concentration. In addition, here, since the processing condition such as the pressure in the process chamber 201, the gas supply time, or the like, can be controlled to finely adjust a ratio of an O component in the SiOCN film or the SiOC film, i.e., the oxygen concentration, the composition ratio of the SiOCN film or the SiOC film can be more precisely controlled. Permittivity of the SiOCN film or the SiOC film formed thereby can be adjusted, an etching resistance can be improved, or insulation can be improved.

(e) According to the embodiment, the carbon concentration in the SiOCN film or the SiOC film can be increased using the amine-based gas composed of three elements of carbon, nitrogen and hydrogen, which is the first reaction gas, and having a greater number of carbon atoms than nitrogen atoms in the composition formula (one molecule).

In particular, the carbon concentration in the SiOCN film or the SiOC film can be increased using the amine-based gas including a plurality of ligands containing carbon (C) atoms in the composition formula (one molecule), which is the first reaction gas, i.e., the amine-based gas including a plurality of hydrocarbon groups such as alkyl groups in the composition formula (one molecule). Specifically, the carbon concentration in the SiOCN film or the SiOC film can be increased using TEA gas, TMA gas, TPA gas, TIPA gas, TBA gas, or TIBA gas including three ligands (hydrocarbon groups such as alkyl groups containing carbon (C) atoms in composition formula (one molecule), or DEA gas, DMA gas, DPA gas, DIPA gas, DBA gas, DIBA gas, or the like including two ligands (hydrocarbon groups such as alkyl groups) containing carbon (C) atoms in the composition formula (one molecule), which is the first reaction gas.

(f) According to the embodiment, a cycle rate (a thickness of the SiOCN layer or the SiOC layer formed by a unit cycle), or a nitrogen concentration or a carbon concentration of the SiOCN film or the SiOC film can be finely adjusted by the number of ligands (the number of hydrocarbon groups such as alkyl groups) containing carbon atoms included in the first reaction gas, i.e., by appropriately varying a gas species of the first reaction gas.

For example, the cycle rate can be improved and a ratio of the nitrogen concentration with respect to the carbon concentration (a ratio of nitrogen concentration/carbon concentration) in the SiOCN film or the SiOC film can be increased using the amine-based gas including two ligands (hydrocarbon groups such as alkyl groups or the like) containing carbon atoms in the composition formula (one molecule) such as DEA gas, which is the first reaction gas, in comparison with the amine-based gas including three ligands (hydrocarbon groups such as alkyl groups or the like) containing carbon atoms in the composition formula (one molecule) such as TEA gas or the like.

In addition, for example, a ratio of the carbon concentration with respect to the nitrogen concentration (a ratio of carbon concentration/nitrogen concentration) in the SiOCN film or the SiOC film can be increased using the amine-based gas including three ligands (hydrocarbon groups such as alkyl groups or the like) in the composition formula (one molecule) such as TEA gas, which is the first reaction gas, in comparison with the case of using the amine-based gas including two ligands (hydrocarbon groups such as alkyl group or the like) containing carbon atoms in the composition formula (one molecule) such as DEA gas or the like.

(g) According to the embodiment, the pressure in the process chamber 201 when the first reaction gas is supplied can be controlled to finely adjust the carbon concentration in the SiOCN film or the SiOC film.

For example, the carbon concentration in the SiOCN film or the SiOC film can be further increased by increasing the pressure in the process chamber 201 when the TEA gas is supplied to the wafer 200 in step 2 more than the pressure in the process chamber 201 when the HCDS gas is supplied to the wafer 200 in step 1. In addition, the carbon concentration in the SiOCN film or the SiOC film can be further increased by increasing the pressure in the process chamber 201 when the TEA gas is supplied to the wafer 200 more than the pressure in the process chamber 201 when the $O_2$ gas is supplied to the wafer 200 in step 3.

In addition, for example, an increment of the carbon concentration in the SiOCN film or the SiOC film can be appropriately suppressed by setting the pressure in the process chamber 201 when the TEA gas is supplied to the wafer 200 in step 2 to the pressure in the process chamber 201 when the $O_2$ gas is supplied to the wafer 200 in step 3 or less, or the pressure in the process chamber 201 when the HCDS gas is supplied to the wafer 200 in step 1 or less.

(h) According to the embodiment, reaction controllability, in particular, composition controllability when the SiOCN film or the SiOC film is formed using the TEA gas, which is the amine-based gas, composed of three elements of carbon, nitrogen and hydrogen and containing no silicon and no metal, can be improved. That is, in the film-forming sequence of the embodiment using the TEA gas, which is the first reaction gas, reaction controllability, in particular, composition controllability when the first layer is formed by reacting the first reaction gas with the silicon-containing layer including Cl, which is the initial layer, can be improved, in comparison with the film-forming sequence using, for example, tetrakisethylmethylaminohafnium (Hf[N($C_2H_5$)($CH_3$)]$_4$, abbreviation: TEMAH) gas or the like composed of four elements of hafnium, carbon, nitrogen and hydrogen, which is the first reaction gas. Accordingly, composition control of the SiOCN film or the SiOC film can be easily performed.

(i) According to the embodiment, an impurity concentration in the SiOCN film or the SiOC film formed using the TEA gas, which is the amine-based gas, composed of three elements of carbon, nitrogen and hydrogen and containing no silicon and no metal, serving as the first reaction gas, can be reduced. That is, in the film-forming sequence of the embodiment using the TEA gas serving as the first reaction gas, mixing probability of the impurity element into the first layer formed by the reaction of the first reaction gas with the silicon-containing layer including Cl, which is the initial layer, can be reduced, and the impurity concentration in the formed SiOCN film or SiOC film can be increased, in comparison with the film-forming sequence using, for example, the TEMAH gas composed of four elements of hafnium, carbon, nitrogen and hydrogen, which is the first reaction gas.

(j) According to the embodiment, film thickness uniformity in the surface of the wafer 200 and between surfaces of the wafers 200 of the SiOCN film or the SiOC film can be improved using the TEA gas, which is the amine-based gas, composed of three elements of carbon, nitrogen and hydrogen and containing no silicon and no metal, serving as the first reaction gas. That is, since the TEA gas composed of three elements of carbon, nitrogen and hydrogen has higher reactivity with respect to the silicon-containing layer including Cl in comparison with the TEMAH gas composed of four elements of hafnium, carbon, nitrogen and hydrogen, the film-forming sequence of the embodiment using the TEA gas serving as the first reaction gas can securely or uniformly perform the reaction of the silicon-containing layer including Cl serving as the first reaction gas and the initial layer through the surface of the wafer 200 and between the surfaces of the wafers 200. As a result, film thickness uniformity in the surface of the wafer 200 and between the surfaces of the wafers 200 in the SiOCN film or the SiOC film can be improved.

Another Embodiment of the Invention

While the embodiment of the present invention has been described above in detail, the present invention is not limited to the above-mentioned embodiment buy may be varied without departing from the spirit of the present invention.

Figure 9:
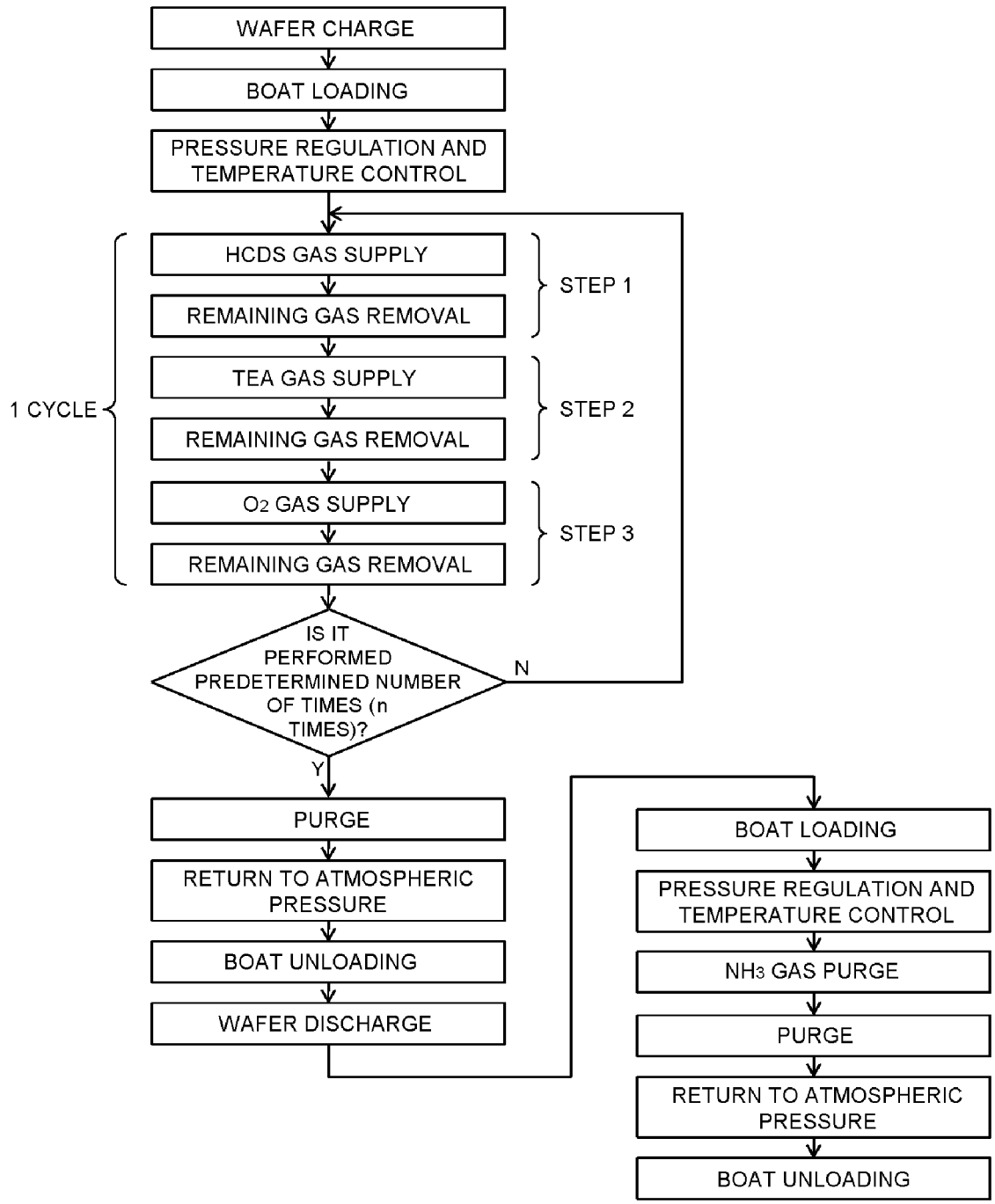
FIG. 9 is a view showing the film-forming flow of the other embodiment of the present invention.

For example, while the processing of modifying the byproduct ($NH_3$ gas purge) is performed before the boat unloading in the above-mentioned embodiment, the processing may be performed after the boat unloading. In this case, after the SiOCN film or the SiOC film is formed as shown in FIG. 9, the boat unloading is performed without performing the $NH_3$ gas purge, and when the wafer discharge is terminated, the empty boat 217 is conveyed into the process chamber 201. Then, the pressure regulation and temperature control, $NH_3$ gas purge, purge, return to atmospheric pressure, and boat unloading of the above-mentioned embodiment are sequentially performed. While there is almost no influence on the film quality of the SiOCN film or the SiOC film even when the NH$_3$ gas purge is performed as described above, when the NH$_3$ gas purge is performed after the boat unloading, influence on the film quality of the SiOCN film or the SiOC film by the NH$_3$ gas purge can be more securely avoided.

In addition, a sequence and processing conditions of the NH$_3$ gas purge performed after the boat unloading are substantially similar to those of the NH$_3$ gas purge of the above-mentioned embodiment. However, a temperature of the heater 207 in the NH$_3$ gas purge may be set such that the temperature in the process chamber 201 is the temperature or more in the process chamber 201 in the above-mentioned SiOCN film or SiOC film forming process. For example, the temperature of the heater 207 may be set such that the temperature in the process chamber 201 is a temperature within a range of, for example, 650 to 750° C. In this case, a nitriding power by the NH$_3$ gas can be further increased to further efficiently perform the modification of the byproducts. However, when the temperature in the process chamber 201 in the NH$_3$ gas purge is set to be equal to the temperature in the process chamber 201 in the above-mentioned SiOCN film or SiOC film forming process, a time needed to raise the temperature and lower the temperature can be omitted, and a total time of the processing of modifying the byproduct can be reduced, improving productivity.

In addition, for example, the processing of modifying the byproducts (NH$_3$ gas purge) may be performed both before and after the boat unloading. In this case, the temperature of the heater 207 in the NH$_3$ gas purge performed before the boat unloading is set such that the temperature in the process chamber 201 is equal to the temperature in the process chamber 201 in the above-mentioned SiOCN film or SiOC film forming process within a range of, for example, 250 to 700° C., preferably 300 to 650° C., more preferably 350 to 600° C. In addition, a time in which the NH$_3$ gas is supplied into the process chamber 201 is set to a time within a range of, for example, 3 to 20 minutes, preferably 5 to 10 minutes. In addition, in the NH$_3$ gas purge performed after the boat unloading, the temperature of the heater 207 is set such that the temperature in the process chamber 201 is substantially equal to or greater than the temperature in the process chamber 201 in the above-mentioned SiOCN film or SiOC film forming process within a range of, for example, 650 to 750° C. In addition, a time in which the NH$_3$ gas is supplied into the process chamber 201 is set to a time within a range of, for example, 5 to 60 minutes, preferably 10 to 30 minutes.

Figure 10:
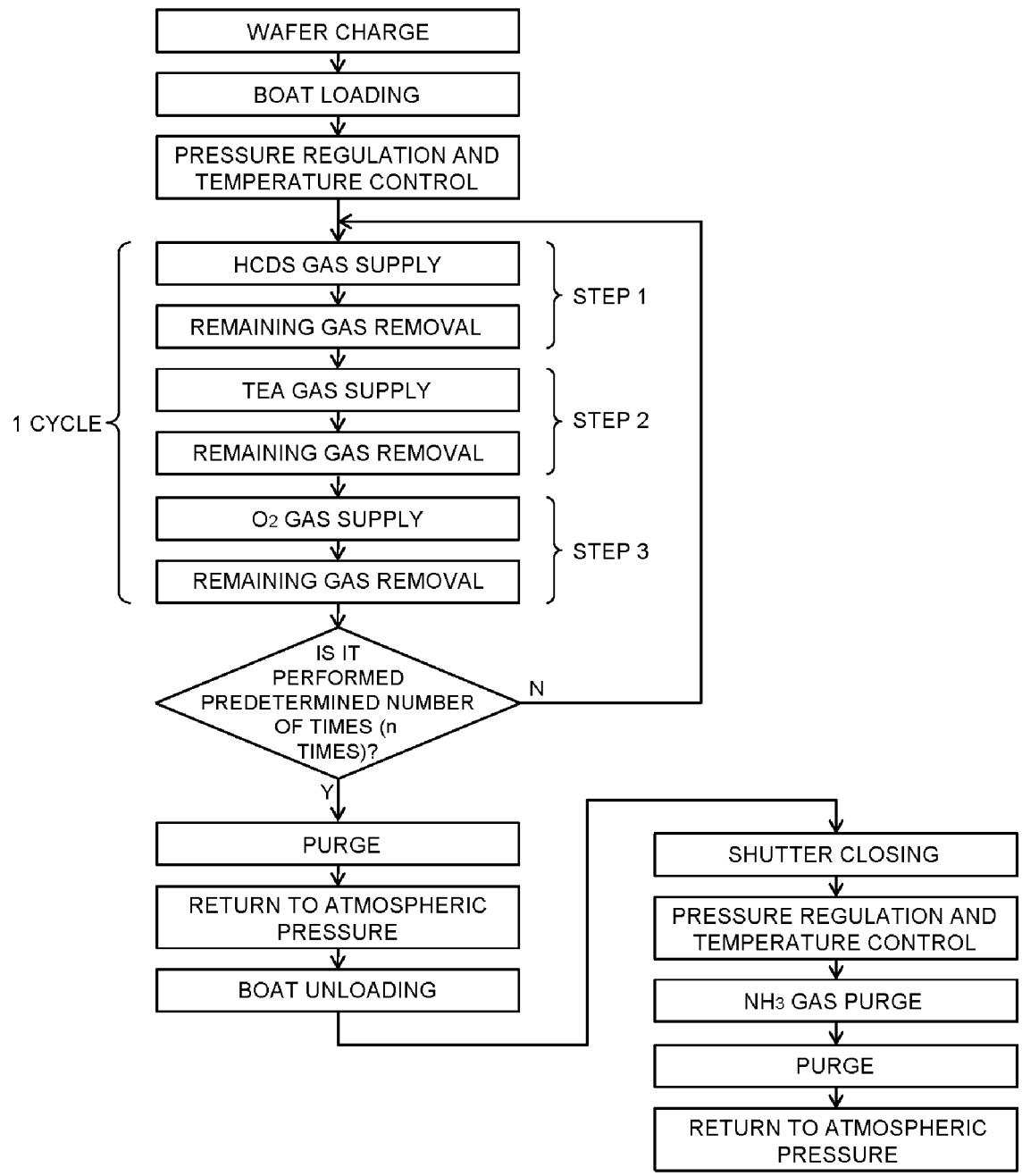
FIG. 10 is a view showing the film-forming flow of the other embodiment of the present invention.

Further, for example, when the processing of modifying the byproducts (NH$_3$ gas purge) is performed after the boat unloading, the NH$_3$ gas purge may be performed without loading the empty boat 217 into the process chamber 201. That is, the NH$_3$ gas purge may be performed in parallel with the wafer discharge without waiting for completion of the wafer discharge. In this case, as shown in FIG. 10, after the boat unloading, the NH$_3$ gas purge is performed in a state in which the shutter 219s is moved by the shutter opening/closing mechanism 115s and the lower end opening of the reaction tube 203 is hermetically sealed, i.e., in a state in which the boat 217 is not present in the process chamber 201. As described above, when the NH$_3$ gas purge is performed in parallel during a standby time waiting for completion of the wafer discharge, the entire consumption time of the substrate processing process including the NH$_3$ gas purge can be reduced to improve efficiency of the substrate processing, improving productivity.

In addition, in the above-mentioned embodiment, while the example in which steps 1 to 3 are set as one cycle and the cycle is performed a predetermined number of times to form the SiOCN film or the SiOC film has been described, the film-forming sequence according to the embodiment is not limited to the above-mentioned type but may be varied as follows.

Figure 6:
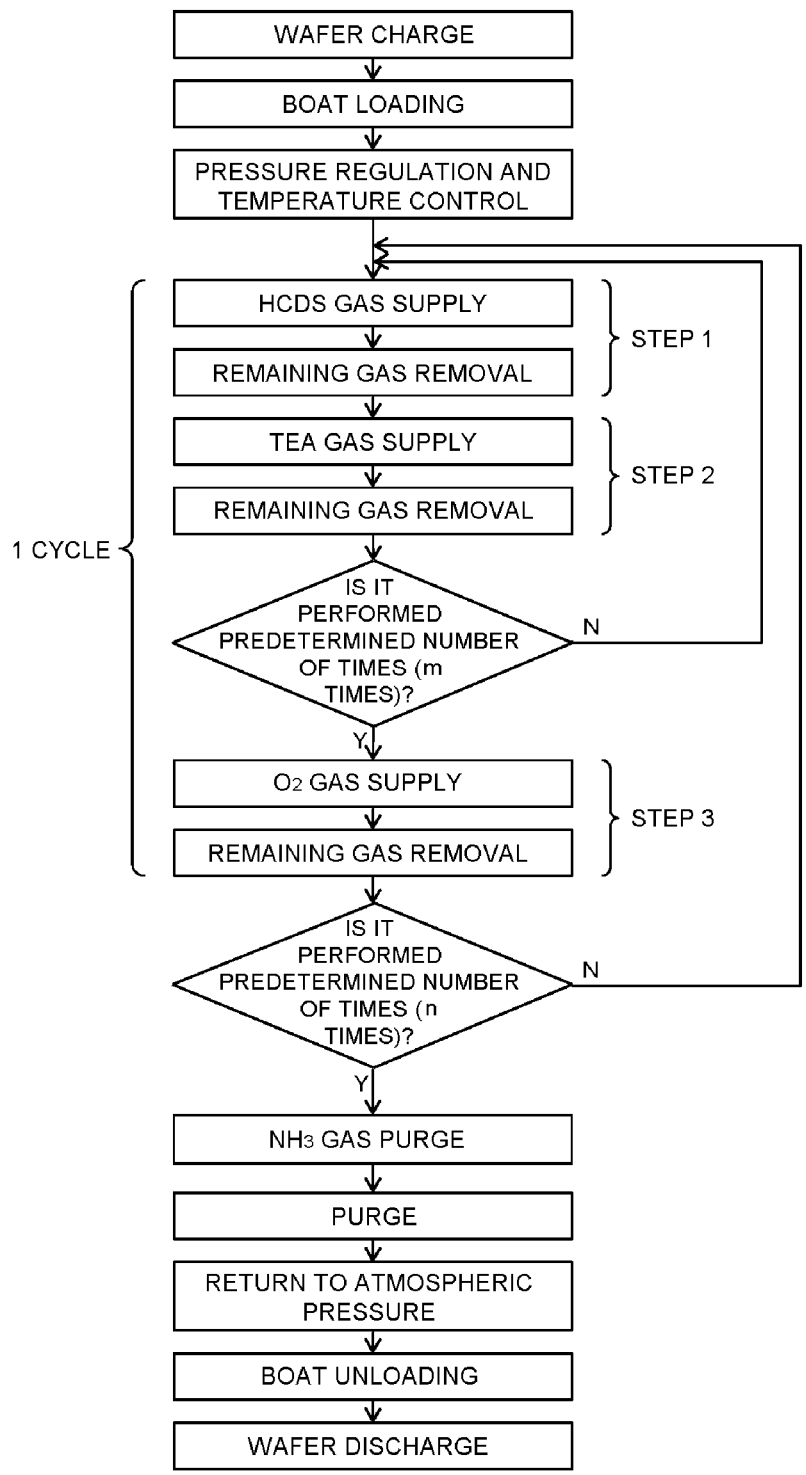
FIG. 6 is a view showing a film-forming flow of another embodiment of the present invention.

For example, like the variant shown in FIG. 6, after steps 1 and 2 are set as one set and the set is performed a predetermined number of times (m times), step 3 may be performed, these may be set as one cycle, and the cycle may be performed a predetermined number of times (n times). That is, a SiOCN film or a SiOC film having a predetermined composition and a predetermined film thickness may be formed on the wafer 200 by performing a cycle a predetermined number of times (n times), the cycle including a process of forming a first layer including silicon, nitrogen and carbon on the wafer 200 by alternately performing a process of supplying a chlorosilane-based source gas (HCDS gas) to the wafer 200 in the process chamber 201) and a process of supplying an amine-based gas (TEA gas) to the wafer 200 in the process container a predetermined number of times (m times); and a process of supplying an oxidizing gas (O$_2$ gas) to the wafer 200 in the process chamber 201 and modifying the first layer to form the SiOCN layer or the SiOC layer, which is a second layer. In addition, the variant is distinguished from the above-mentioned film-forming sequence shown in FIGS. 4 and 5 in that after steps 1 and 2 are set as one set and the set is performed a predetermined number of times (m times), step 3 is performed and these are set as one cycle, but other details are similar to those of the film-forming sequence shown in FIGS. 4 and 5. In addition, the phrase "performed a predetermined number of times" means "performed one or a plurality of times, i.e., performed one or more times." In addition, the case in which a set of steps 1 and 2 is performed one time (m=1) corresponds to the film-forming sequence shown in FIGS. 4 and 5.

Figure 7:
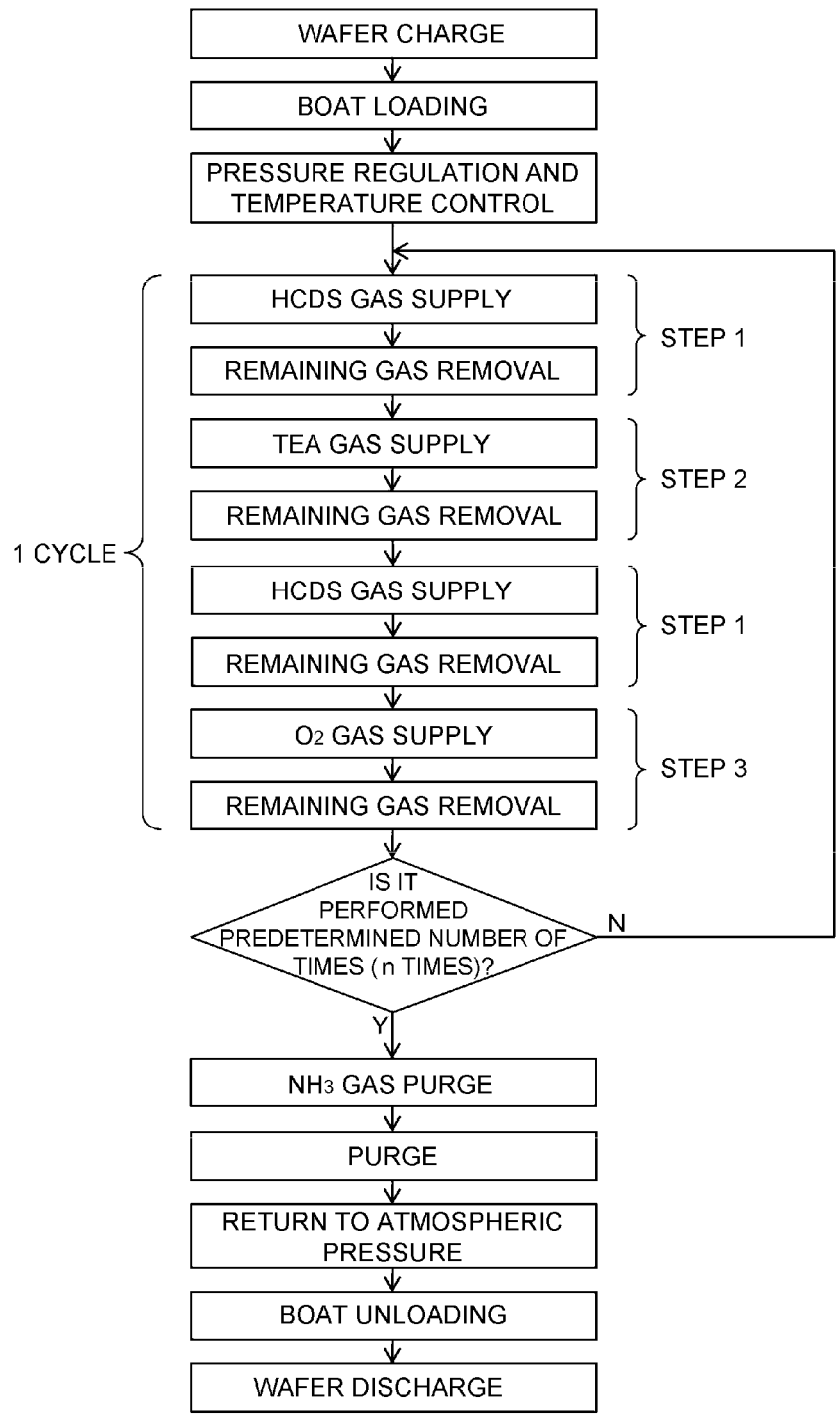
FIG. 7 is a view showing the film-forming flow of the other embodiment of the present invention.

In addition, for example, like the variant shown in FIG. 7, steps 1, 2, 1 and 3 are sequentially performed and these are set as one cycle, and the cycle may be performed a predetermined number of times (n times). That is, a SiOCN film or a SiOC film having a predetermined composition and a predetermined film thickness formed by depositing a first layer and a second layer may be formed on the wafer 200 by performing a cycle a predetermined number of times (n times), the cycle including a process of forming the first layer including silicon, nitrogen and carbon on the wafer 200 by alternately performing a process of supplying a chlorosilane-based source gas (HCDS gas) to the wafer 200 in the process chamber 201 and a process of supplying an amine-based gas (TEA gas) to the wafer 200 in the process container one time; and a process of forming a silicon oxide layer (a SiO layer), which is the second layer, on the first layer by alternately performing a process of supplying a chlorosilane-based source gas (HCDS gas) to the wafer 200 in the process chamber 201 and a process of supplying an oxidizing gas (O$_2$ gas) to the wafer 200 in the process chamber 201 one time. In addition, the variant is distinguished from the above-mentioned film-forming sequence shown in FIGS. 4 and 5 in that steps 1, 2, 1 and 3 are set as one cycle, but other details are similar to those of the film-forming sequence shown in FIGS. 4 and 5.

Figure 8:
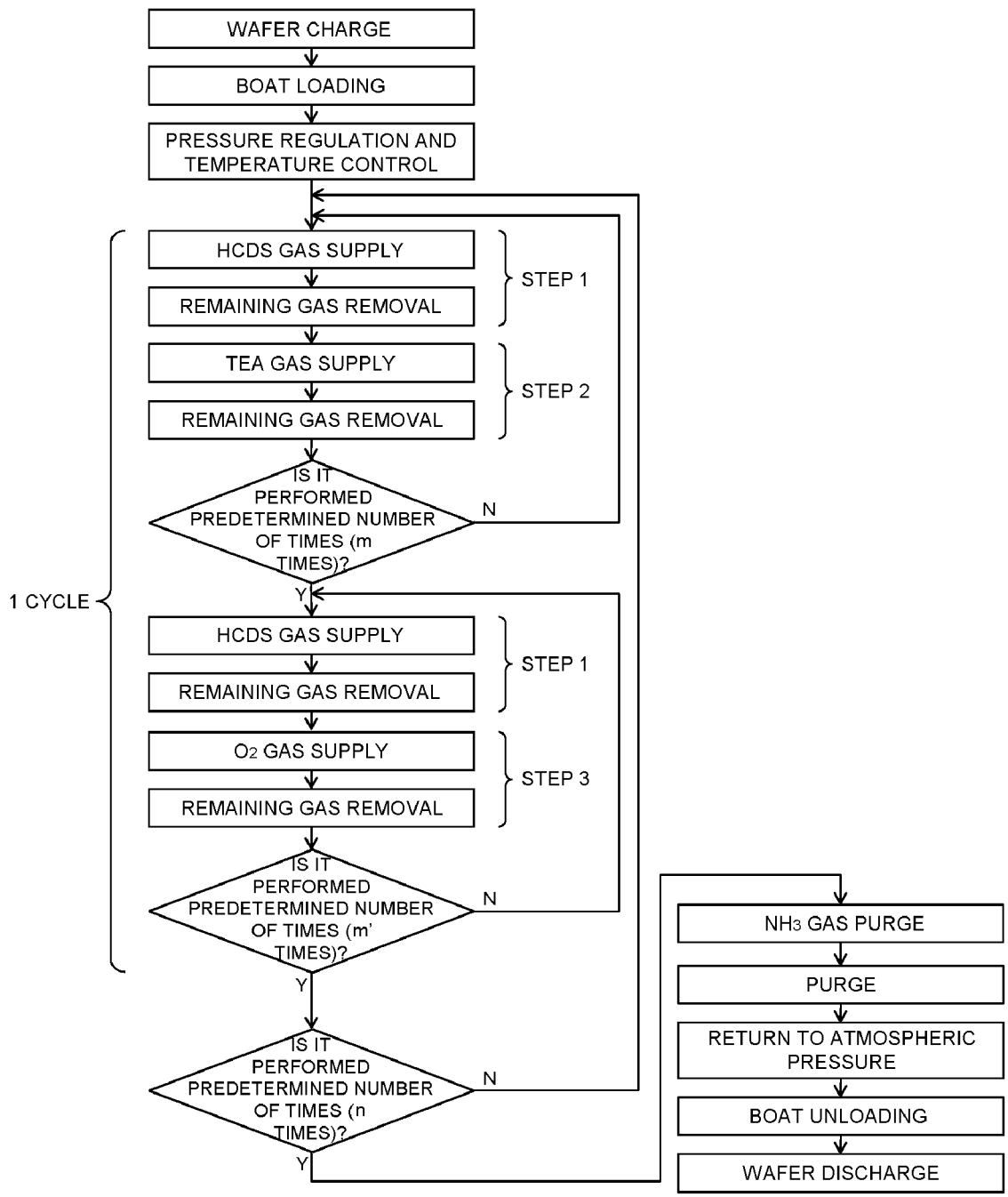
FIG. 8 is a view showing the film-forming flow of the other embodiment of the present invention.

In addition, for example, similar to the variant shown in FIG. 8, after steps 1 and 2 are set as one set and the set is performed a predetermined number of times (m times), and steps 1 and 3 are set as one set and the set is performed a predetermined number of times (m' times), the sets may be set as one cycle and the cycle may be performed a predetermined number of times (n times). That is, a SiOCN film or a SiOC film having a predetermined composition and a predetermined film thickness formed by depositing a first layer and a second layer may be formed on the wafer 200 by performing a cycle a predetermined number of times (n times), the cycle including a process of forming the first layer including silicon, nitrogen and carbon on the wafer 200 by alternately performing a process of supplying a chlorosilane-based source gas (HCDS gas) to the wafer 200 in the process container and a process of supplying an amine-based gas (TEA gas) to the wafer 200 in the process container a predetermined number of times (m times); and a process of forming an SiO layer, which is a second layer, on the first layer by alternately performing a process of supplying a chlorosilane-based source gas (HCDS gas) to the wafer 200 in the process container and a process of supplying an oxidizing gas ($O_2$ gas) to the wafer 200 in the process container a predetermined number of times (m' times). In addition, the variant is distinguished from the above-mentioned film-forming sequence shown in FIGS. 4 and 5 in that after the set of steps 1 and 2 is performed a predetermined number of times (m times), the set of steps 1 and 3 is performed a predetermined number of times (m' times), and the sets are set as one cycle, but other details are similar to those of the film-forming sequence shown in FIGS. 4 and 5. In addition, the case in which the set of steps 1 and 2 is performed one time (m=1) and the set of steps 1 and 3 is performed one time (m'=1) in the variant corresponds to the film-forming sequence shown in FIG. 7.

Even in the variant, the nitriding gas ($NH_3$ gas) can be supplied into the process chamber 201 after formation of the thin film, and the unstable byproducts adhered to the surface of the member in the process chamber 201 can be modified into a stable material, accomplishing effects similar to those of the above-mentioned embodiment.

In addition, for example, in the above-mentioned embodiment, while the example in which the chlorosilane-based source gas is supplied to the wafer 200 in the process container when the first layer including Si, N and C is formed and then the amine-based gas is supplied has been described, the supply sequence of the gases may be reversed. That is, the amine-based gas may be supplied, and then the chlorosilane-based source gas may be supplied. That is, one of the chlorosilane-based source gas and the amine-based gas may be supplied, and then the other gas may be supplied. As described above, the supply sequence of the gases may be changed to vary the film quality or the composition ratio of the formed thin film.

In addition, for example, in the above-mentioned embodiment, while the example in which the chlorosilane-based source gas is used as the source gas when the initial layer including a predetermined element (silicon) and a halogen element (chlorine) is formed in step 1 has been described, a silane-based source gas having a halogen-based ligand, in addition to the chloro group, may be used instead of the chlorosilane-based source gas. For example, a fluorosilane-based source gas may be used instead of the chlorosilane-based source gas. Here, the fluorosilane-based source gas refers to a fluorosilane-based source material in a gaseous state, for example, a gas obtained by evaporating a fluorosilane-based source material in a liquid state under a normal temperature and a normal pressure, or a fluorosilane-based source material in a gaseous state under a normal temperature and a normal pressure. In addition, the fluorosilane-based source material refers to a silane-based source material including a fluoro group serving as a halogen group, i.e., a source material including at least silicon (Si) and fluorine (F). That is, here, the fluorosilane-based source material may be referred to as one of halides. For example, tetrafluorosilane, i.e., a silicon fluoride gas such as silicontetrafluoride ($SiF_4$) gas, hexafluorodisilane ($Si_2F_6$) gas, or the like, may be used as the fluorosilane-based source gas. In this case, when the initial layer including a predetermined element and a halogen element is formed, the fluorosilane-based source gas is supplied to the wafer 200 in the process container. In this case, the initial layer is a layer including Si and F, i.e., a silicon-containing layer including F.

In addition, for example, in the above-mentioned embodiment, while the example in which the amine-based gas is used as the first reaction gas when the silicon-containing layer including Cl serving as the initial layer is changed (modified) into the first layer including Si, N and C has been described, for example, a gas containing an organic hydrazine compound, i.e., an organic hydrazine-based gas, may be used as the first reaction gas, instead of the amine-based gas. In addition, the gas containing the organic hydrazine compound may be simply referred to as an organic hydrazine compound gas or an organic hydrazine gas. Here, the organic hydrazine-based gas refers to an organic hydrazine in a gaseous state, for example, a gas obtained by evaporating an organic hydrazine in a liquid state under a normal temperature and a normal pressure, or a gas containing a hydrazine group such as organic hydrazine in a gaseous state under a normal temperature and a normal pressure. The organic hydrazine-based gas is a gas composed of three elements of carbon (C), nitrogen (N) and hydrogen (H) and containing no silicon, or a gas containing no silicon and no metal. For example, a methylhydrazine-based gas obtained by evaporating monomethylhydrazine [$(CH_3)HN_2H_2$, abbreviation: MMH], dimethylhydrazine [$(CH_3)_2N_2H_2$, abbreviation: DMH], trimethylhydrazine [$(CH_3)_2N_2(CH_3)H$, abbreviation: TMH], or the like, or an ethylhydrazine-based gas obtained by evaporating ethylhydrazine [$(C_2H_5)HN_2H_2$, abbreviation: EH] or the like may be used as the organic hydrazine-based gas. In this case, the organic hydrazine-based gas is supplied to the wafer 200 in the process container when the silicon-containing layer including Cl is changed (modified) into the first layer including Si, N and C.

As the silicon-based insulating layer formed by the method according to the above-mentioned embodiments and variants is used as the sidewall spacer, a device-forming technique having a small leak current and good machinability can be provided.

As the silicon-based insulating layer formed by the method according to the above-mentioned embodiments and variants is used as the etching stopper, a device forming technique having good machinability can be provided.

According to the above-mentioned embodiments and variants, a silicon-based insulating layer of an ideal stoichiometric ratio can be formed without using plasma even in the low temperature region. In addition, since the silicon-based insulating layer can be formed without using plasma, it may be applied to a process in which plasma damage may occur, for example, an SADP film of DPT.

In addition, in the above-mentioned embodiment, while the example in which the SiOCN film or the SiOC film is formed using a source gas, an amine-based gas, or an oxygen-containing gas has been described, the present invention is not limited thereto. For example, even when the SiCN film is formed using the source gas and the amine-based gas, the present invention can be applied thereto. In this case, the source gas and the amine-based gas are alternately supplied to form the SiCN film on the wafer. That is, the cycle including the process of supplying the source gas and the process of supplying the amine-based gas is performed a predetermined number of times. Here, gases similar to those of the above-mentioned embodiment may be used as the source gas and the amine-based gas. In addition, processing conditions at this time may be, for example, processing conditions similar to those of the above-mentioned embodiment.

In addition, the present invention may be applied even to the case in which a silicon boron carbonitride film (SiBCN film) or a silicon boronitride film (SiBN film) is formed using a source gas, an amine-based gas, and a boron-containing gas. In this case, the source gas, the amine-based gas and the boron-containing gas are alternately supplied, or the source gas, the amine-based gas, the boron-containing gas and the nitriding gas are alternately supplied to form the SiBCN film or the SiBN film on the wafer. That is, a cycle including a process of supplying the source gas, a process of supplying the amine-based gas and a process of supplying the boron-containing gas is performed a predetermined number of times. Otherwise, a cycle including a process of supplying the source gas, a process of supplying the amine-based gas, a process of supplying the boron-containing gas and a process of supplying the nitriding gas is performed a predetermined number of times. Here, gases similar to those of the above-mentioned embodiment may be used as the source gas, the amine-based gas, and the nitriding gas. In addition, for example, boron trichloride ($BCl_3$) gas, diborane ($B_2H_6$) gas or borazine-based gas may be used as the boron-containing gas. Further, processing conditions at this time may be, for example, processing conditions similar to those of the above-mentioned embodiment.

As described above, the present invention may be applied to the entire substrate processing process using the source gas and the amine-based gas.

In addition, the present invention may be applied to, for example, the case in which a source gas and an aminosilane-based source gas are alternately supplied to form a SiCN film on a wafer, or the case in which a source gas and an organic borazine compound gas are alternately supplied to form a SiBCN film or a SiBN film having a borazine annular skeleton on a wafer. That is, the present invention may be applied to the case in which a cycle including a process of supplying a source gas (a chlorosilane-based source gas) and a process of supplying an aminosilane-based source gas is performed a predetermined number of times, or the case in which a cycle including a process of supplying a source gas and a process of supplying an organic borazine compound gas is performed a predetermined number of times.

Here, a source gas similar to that of the above-mentioned embodiment may be used as the source gas. In addition, for example, trisdimethylaminosilane ($Si[N(CH_3)_2]_3H$, abbreviation: 3DMAS) or the like may be used as the aminosilane-based source gas. Further, for example, n,n',n''-trimethylborazine (abbreviation: TMB) or the like may be used as the organic borazine compound gas. Furthermore, processing conditions at this time may be, for example, processing conditions similar to those of the above-mentioned embodiment.

Even in this case, in particular, when formation of the thin film on the wafer is performed in the low temperature region of 250 to 700° C., or 650° C. or less, the adhesion of the unstable byproducts such as alkylamine salts or the like in the low temperature region (a region not surrounded by the heater) in the process chamber to the member in the process chamber becomes noticeable. For this reason, $NH_3$ after-purge becomes effective.

As described above, the present invention may be applied to not only the substrate processing process of using the source gas and the amine-based gas, but also the substrate processing process of using the source gas and the aminosilane-based source gas or the substrate processing process of using the source gas and the organic borazine compound gas.

In addition, in the above-mentioned embodiment, while the example in which the silicon-based insulating layer (the SiOCN film, the SiOC film) including silicon, which is a semiconductor element, serving as an oxycarbonitride film or an oxycarbide film has been described, the present invention may be applied to the case in which a metal-based thin film including a metal element such as titanium (Ti), zirconium (Zr), hafnium (Hf), tantalum (Ta), aluminum (Al), molybdenum (Mo), or the like, is formed.

That is, the present invention may be applied to the case in which a metal oxycarbonitride film such as a titanium oxycarbonitride film (a TiOCN film), a zirconium oxycarbonitride film (a ZrOCN film), a hafnium oxycarbonitride film (a HfOCN film), a tantalum oxycarbonitride film (a TaOCN film), an aluminum oxycarbonitride film (an AlOCN film), a molybdenum oxycarbonitride film (a MoOCN film), or the like, is formed.

In addition, for example, the present invention may be applied to the case in which a metal oxycarbide film such as a titanium oxycarbide film (a TiOC film), a zirconium oxycarbide film (a ZrOC film), a hafnium oxycarbide film (a HfOC film), a tantalum oxycarbide film (a TaOC film), an aluminum oxycarbide film (an AlOC film), a molybdenum oxycarbide film (a MoOC film), or the like, is formed.

Further, for example, the present invention may be applied to the case in which a metal carbonitride film such as a titanium carbonitride film (a TiCN film), a zirconium carbonitride film (a ZrCN film), a hafnium carbonitride film (a HfCN film), a tantalum carbonitride film (a TaCN film), an aluminum carbonitride film (an AlCN film), a molybdenum carbonitride film (a MoCN film), or the like, is formed.

In this case, the film-forming may be performed in a sequence similar to that of the above-mentioned embodiment using a source gas containing a metal element and a halogen element, instead of the chlorosilane-based source gas of the above-mentioned embodiment. That is, a thin film including a metal element and carbon may be formed on a wafer 200 by performing a cycle a predetermined number of times, the cycle including a process of supplying a source gas containing the metal element and a halogen element to the wafer 200 in the process container and a process of supplying an amine-based gas to the wafer 200 in the process container.

Specifically, a metal-based thin film (a metal oxycarbonitride film) including a metal element, oxygen, carbon and nitrogen, or a metal-based thin film (a metal oxycarbide film) including the metal element, oxygen and carbon may be formed on a wafer 200 by performing a cycle a predetermined number of times, the cycle including a process of forming a first layer including the metal element, nitrogen and carbon on the wafer 200 by alternately performing a process of supplying the metal element and a halogen element to the wafer 200 in the process container and a process of supplying an amine-based gas to the wafer 200 in the process container a predetermined number of times; and a process of supplying an oxidizing gas to the wafer 200 in the process container to modify the first layer to form a second layer. In addition, a metal-based thin film (a metal carbonitride film) including the metal element, carbon and nitrogen may be formed using the source gas containing the metal element and the halogen element, and the amine-based gas.

For example, when a metal-based thin film (a TiOCN film, a TiOC film, or a TiCN film) including Ti is formed, a gas containing Ti and a chloro group such as titanium tetrachloride ($TiCl_4$), which is a source gas, or a gas containing Ti and a fluoro group such as titanium tetrafluoride ($TiF_4$) or the like may be used. Gases similar to those of the above-mentioned embodiment may be used as the amine-based gas and the oxidizing gas. In addition, processing conditions at this time may be, for example, processing conditions similar to those of the above-mentioned embodiment.

In addition, for example, when a metal-based thin film (a ZrOCN film, a ZrOC film, or a ZrCN film) including Zr is formed, a gas containing Zr and a chloro group such as zirconium tetrachloride ($ZrCl_4$) or the like, or a gas containing Zr and a fluoro group such as zirconium tetrafluoride ($ZrF_4$) or the like may be used as the source gas. Gases similar to those of the above-mentioned embodiment may be used as the amine-based gas and the oxidizing gas. In addition, processing conditions at this time may be, for example, processing conditions similar to those of the above-mentioned embodiment.

Further, for example, when a metal-based thin film (a HfOCN film, a HfOC film, or a HfCN film) including Hf is formed, a gas containing Hf and a chloro group such as hafnium tetrachloride ($HfCl_4$) or the like, or a gas containing Hf and a fluoro group such as hafnium tetrafluoride ($HfF_4$) or the like may be used as the source gas. Gases similar to those of the above-mentioned embodiment may be used as the amine-based gas and the oxidizing gas. In addition, processing conditions at this time may be, for example, processing conditions similar to those of the above-mentioned embodiment.

In addition, for example, when a metal-based thin film (a TaOCN film, a TaOC film, or a TaCN film) including Ta is formed, a gas containing Ta and a chloro group such as tantalum pentachloride ($TaCl_5$) or the like, or a gas containing Ta and a fluoro group such as tantalum pentafluoride ($TaF_5$) or the like may be used as the source gas. Gases similar to those of the above-mentioned embodiment may be used as the amine-based gas and the oxidizing gas. Further, processing conditions at this time may be, for example, processing conditions similar to those of the above-mentioned embodiment.

In addition, for example, when a metal-based thin film (an AlOCN film, an AlOC film, or an AlCN film) including Al is formed, a gas containing Al and a chloro group such as aluminum trichloride ($AlCl_3$) or the like, or a gas containing Al and a fluoro group such as aluminum trifluoride ($AlF_3$) or the like may be used as the source gas. Gases similar to those of the above-mentioned embodiment may be used as the amine-based gas and the oxidizing gas. Further, processing conditions at this time may be, for example, processing conditions similar to those of the above-mentioned embodiment.

In addition, for example, when a metal-based thin film (a MoOCN film, a MoOC film, or a MoCN film) including Mo is formed, a gas containing Mo and a chloro group such as molybdenum pentachloride ($MoCl_5$) or the like, or a gas containing Mo and a fluoro group such as molybdenum pentafluoride ($MoF_5$) or the like may be used as the source gas. Gases similar to those of the above-mentioned embodiment may be used as the amine-based gas and the oxidizing gas. In addition, processing conditions at this time may be, for example, processing conditions similar to those of the above-mentioned embodiment.

Even in this case, the nitriding gas ($NH_3$ gas) can be supplied into the process chamber 201 after formation of the thin film, and the unstable byproducts adhered to the surface of the member in the process chamber 201 can be modified in a stable material, accomplishing effects similar to those of the above-mentioned embodiment. That is, the present invention may be applied to the case in which a thin film including a predetermined element such as a semiconductor element or a metal element is formed.

In addition, in the above-mentioned embodiment, while the case in which the thin film is formed using the batch type substrate processing apparatus for processing a plurality of substrates at a time has been described, the present invention is not limited thereto but may be applied to the case in which the thin film is formed using a single wafer type substrate processing apparatus for processing one or a plurality of substrates at a time. In addition, in the above-mentioned embodiment, while the example in which the thin film is formed using the substrate processing apparatus including the hot wall type processing furnace has been described, the present invention is not limited thereto but may be applied to the case in which the thin film is formed using the substrate processing apparatus including a cold wall type processing furnace.

In addition, the above-mentioned embodiments, variants or applications may be appropriately combined and used.

Further, for example, the present invention is realized even when the process recipe of the substrate processing apparatus of the related art is varied. When the process recipe is changed, the process recipe according to the present invention may be installed at the substrate processing apparatus of the related art via an electrical communication line or a non-transitory computer-readable recording medium on which the process recipe is recorded, or the process recipe itself may be changed with a process recipe according to the present invention by manipulating the input/output device of the substrate processing apparatus of the related art.

Example

SiOCN films were formed on a plurality of wafers by the film-forming sequence of the above-mentioned embodiment and a modification ($NH_3$ gas purge) sequence of the byproducts using the substrate processing apparatus of the above-mentioned embodiment as an example of the present invention. HCDS gas was used as a source gas, TEA gas was used as a first reaction gas (amine-based gas), $O_2$ gas was used as a second reaction gas (an oxidizing gas), and $NH_3$ gas was used as a modifying gas (a nitriding gas). A wafer temperature upon the film-forming was a temperature within a range of 600 to 650° C. Two estimation samples were drafted by setting supply times of $NH_3$ gas in the $NH_3$ gas purge to 10 minutes and 30 minutes. The processing conditions were set to predetermined values within ranges of the processing conditions described in the above-mentioned embodiment. In addition, the number of foreign substances adhered to the wafer and a refractive index of the SiOCN film formed on the wafer were measured.

In addition, as a comparative example, SiOCN films were formed on a plurality of wafers by the film-forming sequence of the above-mentioned embodiment using the substrate processing apparatus of the above-mentioned embodiment. In the comparative example, the modification ($NH_3$ gas purge) of the byproducts was not performed but omitted. HCDS gas was used as a source gas, TEA gas was used as a first reaction gas (an amine-based gas), and $O_2$ gas was used as a second reaction gas (an oxidizing gas). A wafer temperature upon the film-forming was set to a temperature within a range of 600 to 650° C. The processing conditions were set to predetermined values within ranges of the processing conditions described in the above-mentioned embodiment. In addition the number of foreign substances adhered to the wafer and a refractive index of the SiOCN film formed on the wafer were measured.

Figure 11:
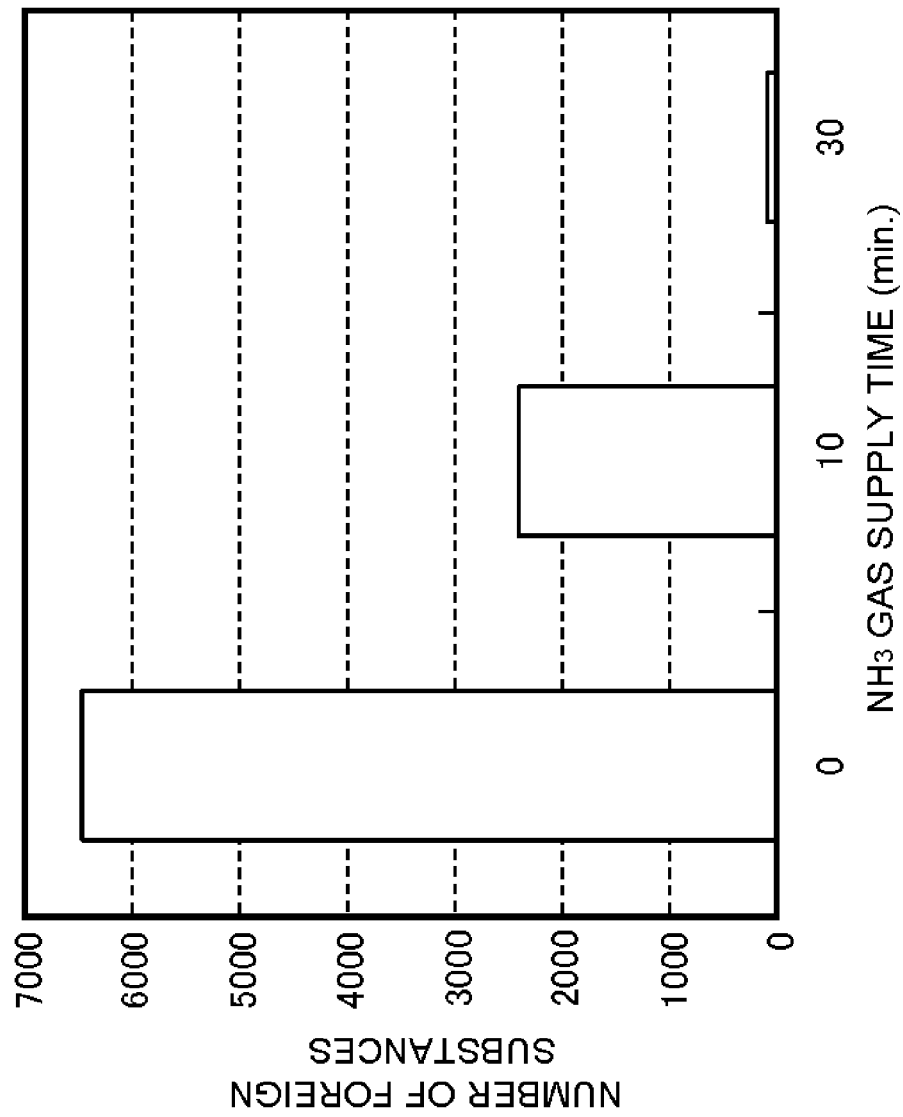
FIG. 11 is a view for describing a measurement result of the number of foreign substances in an example and a comparative example of the present invention.
Figure 12:
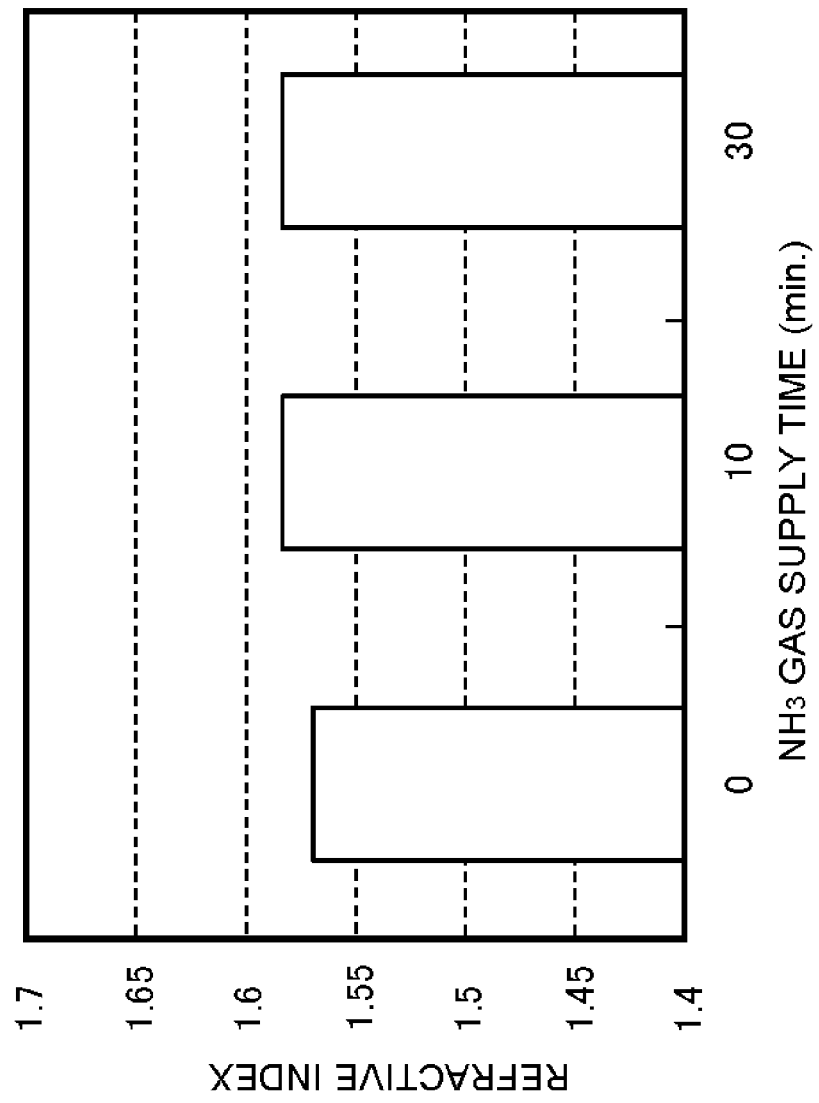
FIG. 12 is a view for describing a measurement result of a refractive index of a SiOCN film in the example and the comparative example of the present invention.

FIG. 11 is a view for describing a measurement result of the number of foreign substances in the example and the comparative example of the present invention. A horizontal axis of FIG. 11 shows a supply time of the $NH_3$ gas in the $NH_3$ gas purge, and a vertical axis shows the number of foreign substances detected on the wafer. In addition, FIG. 12 is a view for describing a measurement result of the refractive indexes of the SiOCN films in the example and the comparative example of the present invention. A horizontal axis of FIG. 12 shows a supply time of the $NH_3$ gas in the $NH_3$ gas purge, and a vertical axis shows the refractive index of the SiOCN film formed on the wafer. Zero (0) of the supply time of the $NH_3$ gas in the $NH_3$ gas purge of FIGS. 11 and 12 shows the case in which the $NH_3$ gas purge is omitted, i.e., an evaluation result of the comparative example.

According to FIG. 11, it will be appreciated that the adhesion of the foreign substances to the wafer is suppressed in the example in which the $NH_3$ gas purge is performed, in comparison with the comparative example in which the $NH_3$ gas purge is omitted. In particular, it will be appreciated that the adhesion of the foreign substances to the wafer is extremely effectively suppressed when the supply time of the $NH_3$ gas in the $NH_3$ gas purge is set to 30 minutes. That is, it will be appreciated that, as the $NH_3$ gas purge is performed, the unstable byproducts adhered to the surface of the member in the process chamber can be modified into a stable material, and generation of the foreign substances from the deposited film formed by accumulating the byproducts can be suppressed. In addition, according to FIG. 12, it will be appreciated that there is little difference between the refractive indexes of the SiOCN films of the example and the comparative example. That is, it will be appreciated that, even when the $NH_3$ gas purge is performed without unloading the wafer on which the SiOCN film is formed from the inside of the process chamber, none of the SiOCN film is nitrated or only an extremely shallow surface layer is nitrated even though the nitration is performed, and there is no influence on the film quality of the entire SiOCN film.

In addition, it has been confirmed that, even in the other example in which the SiOC film is formed instead of the SiOCN film, effects similar to those of the other comparative example in which the SiOC film is formed while omitting the $NH_3$ gas purge, i.e., the effect of suppressing the adhesion of the foreign substances to the wafer can be obtained. In addition, in the example, it has been confirmed that, even when the $NH_3$ gas purge is performed without unloading the wafer on which the SiOC film is formed from the inside of the process chamber, none of the SiOC film is nitrated or only an extremely shallow surface layer is nitrated even though the nitration is performed, and there is no influence on the film quality of the entire SiOC film.

In addition, the fact that, even when the $NH_3$ gas purge is performed without unloading the wafer on which the SiOCN film or the SiOC film is formed from the inside of the process chamber, none of the SiOCN film or the SiOC film is nitrated or only an extremely shallow surface layer is nitrated even when the nitration is performed, is considered to be due to the fact that the SiOCN film or the SiOCN film formed by the method of the embodiment is a film having strong bonding power (a bonding power between composition materials) and high density in a structure.

According to the present invention, it is possible to provide a method of manufacturing a semiconductor device that is capable of suppressing generation of foreign substances and forming a good thin film in a low temperature region, a method of processing a substrate, a substrate processing apparatus and a recording medium.

Exemplary Modes of the Invention

Hereinafter, exemplary modes of the present invention will be supplementarily stated.

(Supplementary Note 1)

According to an aspect of the present invention, there is provided a method of manufacturing a semiconductor device, including:

(a) forming a thin film containing at least a predetermined element and carbon on a substrate by performing a cycle a predetermined number of times, the cycle including: supplying a source gas containing the predetermined element and a halogen element to the substrate in a process container; and supplying an amine-based gas to the substrate in the process container; and (b) modifying byproducts adhered to an inside of the process container by supplying a nitriding gas into the process container after forming the thin film.

(Supplementary Note 2)

The method of manufacturing a semiconductor device according to supplementary note 1, wherein the cycle may further include supplying an oxidizing gas to the substrate in the process container, and the thin film may include the predetermined element, oxygen, the carbon and nitrogen or the predetermined element, oxygen and the carbon.

(Supplementary Note 3)

The method of manufacturing a semiconductor device according to supplementary note 1 or supplementary note 2, wherein the step (b) is performed while the substrate with the thin film formed thereon is accommodated in the process container.

(Supplementary Note 4)

The method of manufacturing a semiconductor device according to any one of supplementary note 1 to supplementary note 3 may further include, unloading the substrate with the thin film formed thereon from the inside of the process container after the step (b).

(Supplementary Note 5)

The method of manufacturing a semiconductor device according to supplementary note 1 or supplementary note 2 may further include, unloading the substrate with the thin film formed thereon from the inside of the process container before modifying the byproducts.

(Supplementary Note 6)

In the method of manufacturing a semiconductor device according to any one of supplementary note 1 to supplementary note 5, the byproducts may include an alkyl group.

(Supplementary Note 7)

In the method of manufacturing a semiconductor device according to any one of supplementary note 1 to supplementary note 6, the byproducts may include an alkylamine salt.

(Supplementary Note 8)

In the method of manufacturing a semiconductor device according to any one of supplementary note 1 to supplementary note 7, the amine-based gas may include amine.

(Supplementary Note 9)

In the method of manufacturing a semiconductor device according to any one of supplementary note 1 to supplementary note 8, the amine-based gas may include at least one amine selected from a group consisting of ethylamine, methylamine, propylamine, isopropylamine, butylamine and isobutylamine.

(Supplementary Note 10)

In the method of manufacturing a semiconductor device according to any one of supplementary note 1 to supplementary note 9, the amine-based gas may include at least one amine selected from the group consisting of triethylamine, diethylamine, monoethylamine, trimethylamine, dimethylamine, monomethylamine, tripropylamine, dipropylamine, monopropylamine, triisopropylamine, diisopropylamine, monoisopropylamine, tributylamine, dibutylamine, monobutylamine, triisobutylamine, diisobutylamine and monoisobutylamine.

(Supplementary Note 11)

In the method of manufacturing a semiconductor device according to any one of supplementary note 1 to supplementary note 10, the thin film may contain the predetermined element, the carbon and nitrogen.

(Supplementary Note 12)

According to another aspect of the present invention, there is provided a method of manufacturing a semiconductor device, including:

forming a thin film containing a predetermined element, oxygen, carbon and nitrogen or a thin film containing the predetermined element, oxygen and carbon on a substrate by performing a cycle a predetermined number of times, the cycle including: supplying a source gas containing the predetermined element and a halogen element to the substrate in a process container, supplying an amine-based gas to the substrate in the process container and supplying an oxidizing gas to the substrate in the process container; and modifying byproducts adhered to an inside of the process container by supplying a nitriding gas into the process container after forming the thin film.

(Supplementary Note 13)

According to yet another aspect of the present invention, there is provided a method of manufacturing a semiconductor device, including:

forming a thin film containing a predetermined element, oxygen, carbon and nitrogen, or a thin film containing the predetermined element, oxygen and carbon by performing a cycle a predetermined number of times, the cycle including:

forming a first layer containing the predetermined element, nitrogen and carbon on a substrate by alternately performing a process of supplying the predetermined element and a halogen element to the substrate in a process container and a process of supplying an amine-based gas to the substrate in the process container a predetermined number of times, and forming a second layer by supplying an oxidizing gas to the substrate in the process container to modify the first layer; and modifying byproducts adhered to an inside of the process container by supplying a nitriding gas into the process container after forming the thin film.

(Supplementary Note 14)

According to yet another aspect of the present invention, there is provided a method of processing a substrate, including:

forming a thin film containing at least a predetermined element and carbon on a substrate by performing a cycle a predetermined number of times, the cycle including: supplying a source gas containing the predetermined element and a halogen element to the substrate in a process container; and supplying an amine-based gas to the substrate in the process container; and modifying byproducts adhered to an inside of the process container by supplying a nitriding gas into the process container after forming the thin film.

(Supplementary Note 15)

According to yet another aspect of the present invention, there is provided a substrate processing apparatus including:

a process container configured to accommodate a substrate;

a source gas supply system configured to supply a source gas containing a predetermined element and a halogen element into the process container;

an amine-based gas supply system configured to supply an amine-based gas into the process container;

a nitriding gas supply system configured to supply a nitriding gas into the process container; and a control unit configured to control the source gas supply system, the amine-based gas supply system and the nitriding gas supply system so as to perform: a process of forming a thin film containing at least the predetermined element and carbon on the substrate by performing a cycle a predetermined number of times, the cycle including supplying the source gas to the substrate in the process container and supplying the amine-based gas to the substrate in the process container; and a process of modifying byproducts adhered to an inside of the process container by supplying the nitriding gas into the process container after forming the thin film.

(Supplementary Note 16)

According to yet another aspect of the present invention, there is provided a program that causes a computer to perform:

a sequence of forming a thin film containing at least a predetermined element and carbon on a substrate by performing a cycle a predetermined number of times, the cycle including: supplying a source gas containing the predetermined element and a halogen element to the substrate in a process container; and supplying an amine-based gas to the substrate in the process container; and a sequence of modifying byproducts adhered to an inside of the process container by supplying a nitriding gas into the process container after forming the thin film.

(Supplementary Note 17)

According to still another aspect, there is provided a non-transitory computer-readable recording medium storing a program that causes a computer to perform:

a sequence of forming a thin film containing at least a predetermined element and carbon on a substrate by performing a cycle a predetermined number of times, the cycle including: supplying a source gas containing the predetermined element and a halogen element to the substrate in a process container; and supplying an amine-based gas to the substrate in the process container; and a sequence of modifying byproducts adhered to an inside of the process container by supplying a nitriding gas into the process container after forming the thin film.

What is claimed is:

1. A method of manufacturing a semiconductor device, comprising:
   (a) forming a thin film containing at least a predetermined element and carbon on a substrate by performing a cycle a predetermined number of times, the cycle comprising:
      (a-1) supplying a source gas containing the predetermined element and a halogen element to the substrate in a process container; and
      (a-2) supplying an amine-based gas to the substrate in the process container; and
   (b) modifying byproducts adhered to an inside of the process container by supplying a nitriding gas into the process container after forming the thin film.

2. The method of claim 1, wherein the cycle further comprises supplying an oxidizing gas to the substrate in the process container, and the thin film contains the predetermined element, oxygen, carbon and nitrogen or the predetermined element, oxygen and carbon.

3. The method of claim 1, wherein the step (b) is performed while the substrate with the thin film formed thereon is accommodated in the process container.

4. The method of claim 1, further comprising unloading the substrate with the thin film formed thereon from the inside of the process container after the step (b).

5. The method of claim 1, further comprising unloading the substrate with the thin film formed thereon from the inside of the process container before the step (b).

6. The method of claim 1, wherein the byproducts comprises an alkyl group.

7. The method of claim 1, wherein the byproducts comprises an alkylamine salt.

8. The method of claim 1, wherein the amine-based gas comprises amine.

9. The method of claim 1, wherein the amine-based gas comprises at least one amine selected from a group consisting of ethylamine, methylamine, propylamine, isopropylamine, butylamine and isobutylamine.

10. The method of claim 1, wherein the amine-based gas comprises at least one amine selected from a group consisting of triethylamine, diethylamine, monoethylamine, trimethylamine, dimethylamine, monomethylamine, tripropylamine, dipropylamine, monopropylamine, triisopropylamine, diisopropylamine, monoisopropylamine, tributylamine, dibutylamine, monobutylamine, triisobutylamine, diisobutylamine and monoisobutylamine.

11. The method of claim 1, wherein the thin film contains the predetermined element, carbon and nitrogen.

12. A method of processing a substrate, comprising: (a) forming a thin film containing at least a predetermined element and carbon on a substrate by performing a cycle a predetermined number of times, the cycle comprising:
 (a-1) supplying a source gas containing the predetermined element and a halogen element to the substrate in a process container; and
 (a-2) supplying an amine-based gas to the substrate in the process container; and
 (b) modifying byproducts adhered to an inside of the process container by supplying a nitriding gas into the process container after forming the thin film.

13. A method of manufacturing a semiconductor device, comprising:
 (a) forming a thin film containing at least a predetermined element, oxygen and carbon on a substrate by performing a cycle a predetermined number of times, the cycle comprising:
  (a-1) supplying a source gas containing the predetermined element and a halogen element to the substrate in a process container;
  (a-2) supplying an amine-based gas to the substrate in the process container; and
  (a-3) supplying an oxidizing gas to the substrate in the process container; and
 (b) modifying byproducts adhered to an inside of the process container by supplying a nitriding gas into the process container after forming the thin film.

14. The method of claim 13, wherein the thin film contains the predetermined element, oxygen, carbon and nitrogen or the predetermined element, oxygen and carbon.

\* \* \* \* \*